(12) United States Patent
Choi et al.

(10) Patent No.: US 9,362,448 B2
(45) Date of Patent: Jun. 7, 2016

(54) NANOSTRUCTURE SEMICONDUCTOR LIGHT EMITTING DEVICE

(71) Applicant: SAMSUNG ELECTRONICS CO., LTD., Suwon-si, Gyeonggi-do (KR)

(72) Inventors: Soo Jeong Choi, Hwaseong-si (KR); Jung Sub Kim, Hwaseong-si (KR); Byung Kyu Chung, Seoul (KR); Yeon Woo Seo, Hwaseong-Si (KR); Dong Gun Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/686,619

(22) Filed: Apr. 14, 2015

(65) Prior Publication Data

US 2016/0072007 A1 Mar. 10, 2016

(30) Foreign Application Priority Data

Sep. 5, 2014 (KR) .................. 10-2014-0119296

(51) Int. Cl.
*H01L 27/15* (2006.01)
*H01L 29/26* (2006.01)
(Continued)

(52) U.S. Cl.
CPC ............... *H01L 33/06* (2013.01); *H01L 27/15* (2013.01); *H01L 33/0025* (2013.01); *H01L 33/08* (2013.01); *H01L 33/12* (2013.01); *H01L 33/32* (2013.01); *H05B 33/0845* (2013.01)

(58) Field of Classification Search
CPC ..... H01L 2924/00; H01L 33/24; H01L 33/18; H01L 33/08; H01L 33/06; H01L 21/02603; H01L 29/0665; H01L 21/0254; H01L 33/007; H01L 33/0075; H01L 21/02458; H01L 2224/73265; H01L 29/2003; H01L 21/0262; H01L 29/413; H01L 33/04; H01L 2924/12041; H01L 33/145; H01L 21/02439; H01L 2221/1094; H01L 21/02389; H01L 51/0048; H01L 21/02601; H01L 2251/5369; H01L 29/15; H01L 29/1606; H01L 31/035209; H01L 31/1828; H01L 31/1848; H01L 31/1884; H01L 33/26; H01L 33/325; H01L 51/428; H01L 51/442; H01L 51/5296; H01L 33/12; H01L 29/06; H01L 29/66; H01L 23/48; H01L 33/44; H01L 33/48; B82Y 10/00; B82Y 20/00; B82Y 40/00; B82Y 30/00; B82Y 35/00; Y10S 977/762; Y10S 977/742; Y10S 977/84
USPC .......... 257/13, E33.008, 14, E33.005, 76, 88, 257/E29.168, 183, E29.005, E29.022, 257/E29.089, E29.166, E29.296, E31.003, 257/E31.033, E33.013, E33.025, E33.027, 257/E33.028, E33.034, E33.064; 977/755, 977/773, 774, 840, 938, 949; 438/24, 27
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

KR 10-1292229 B1 8/2013

OTHER PUBLICATIONS

F. Glas, "Critical dimensions for the plastic relaxation of strained axial heterostructures in free-standing nanowires," Physical Review, B 74, Sep. 7, 2006, pp. 121302-1 through 121302-4.

*Primary Examiner* — Dao H Nguyen
*Assistant Examiner* — Tram H Nguyen
(74) *Attorney, Agent, or Firm* — McDermott Will & Emery LLP

(57) ABSTRACT

There is provided a nanostructure semiconductor light emitting device including a base layer formed of a first conductivity-type nitride semiconductor and a plurality of light emitting nanostructures disposed to be spaced apart from one another on the base layer. Each of the plurality of light emitting nanostructures includes a nanocore formed of the first conductivity-type nitride semiconductor, a stress control layer disposed on a surface of the nanocore and including a nitride semiconductor containing indium, an active layer disposed on the stress control layer and including a nitride semiconductor containing indium, and a second conductivity-type nitride semiconductor layer disposed on the active layer.

20 Claims, 29 Drawing Sheets

(51) Int. Cl.
  *H01L 31/12* (2006.01)
  *H01L 33/00* (2010.01)
  *H01L 33/06* (2010.01)
  *H01L 33/08* (2010.01)
  *H01L 33/32* (2010.01)
  *H01L 33/12* (2010.01)
  *H05B 33/08* (2006.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,396,696 B2 | 7/2008 | Kim et al. |
| 7,429,756 B2 | 9/2008 | Lee |
| 7,501,656 B2 | 3/2009 | Han et al. |
| 7,663,148 B2 | 2/2010 | Yi et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,829,443 B2 | 11/2010 | Seifert et al. |
| 7,863,625 B2 | 1/2011 | Bratkovski et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,030,679 B2 | 10/2011 | Son et al. |
| 8,049,161 B2 | 11/2011 | Sherrer et al. |
| 8,129,711 B2 | 3/2012 | Kang et al. |
| 8,138,493 B2 | 3/2012 | Ohlsson et al. |
| 8,179,938 B2 | 5/2012 | Kim |
| 8,242,523 B2 | 8/2012 | Gwo et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,551,834 B2 | 10/2013 | Ohlsson et al. |
| 8,735,931 B2 | 5/2014 | Han et al. |
| 8,766,295 B2 | 7/2014 | Kim |
| 2010/0006817 A1* | 1/2010 | Ohlsson et al. ............... 257/13 |
| 2011/0204327 A1 | 8/2011 | Hiruma et al. |
| 2011/0309382 A1* | 12/2011 | Lowgren .................... 257/88 |
| 2013/0043457 A1 | 2/2013 | Kang et al. |
| 2013/0221322 A1 | 8/2013 | Ohlsson |
| 2014/0138620 A1* | 5/2014 | Svensson et al. ............. 257/13 |
| 2014/0284551 A1* | 9/2014 | Herner et al. ............... 257/13 |
| 2014/0361244 A1* | 12/2014 | Svensson et al. ............. 257/13 |
| 2014/0367638 A1* | 12/2014 | Herner ........................ 257/13 |

* cited by examiner

A-A'

NANOSTRUCTURE SEMICONDUCTOR LIGHT EMITTING DEVICE

CROSS-REFERENCE TO RELATED APPLICATION

This application claims priority to Korean Patent Application No. 10-2014-0119296 filed on Sep. 5, 2014, with the Korean Intellectual Property Office, the entire contents of which are hereby incorporated by reference.

TECHNICAL FIELD

The present disclosure relates to a nanostructure semiconductor light emitting device and methods for manufacturing the same.

BACKGROUND

Recently, as a new type of semiconductor light emitting device (LED) technology, semiconductor light emitting devices including nanostructures have been developed. In such a semiconductor light emitting device including nanostructures (hereinafter, referred to as "a nanostructure semiconductor light emitting device"), an active layer can be grown on a non-polar plane or a semi-polar plane, preventing degradations in device efficiency due to polarization. Also, since light can be emitted through a relatively large surface area, luminous efficiency may be significantly enhanced. However, indium may not be easily incorporated into an active layer during a growth process, and thus, it may be difficult to obtain emissions of long wavelength light.

In general, when InGaN is grown, indium incorporation differs according to crystal planes. In a case of using an m-plane, a non-polar plane, such as a surface of a nanocore, an indium incorporation ratio of the m-plane is lower than that of a c-plane as a polar plane or an r-plane as a semi-polar plane, and thus, it is difficult to form an active layer emitting light having a relatively long wavelength. Also, a defect such as a stacking fault occurs in the active layer due to a difference in lattice constants between the nanocore formed of n-type GaN and the active layer containing indium, degrading efficiency.

Accordingly, a need exists for an LED having reduced structural stress, reduced stacking fault defects and increased indium incorporation in the active layer.

SUMMARY

Embodiments of the present disclosure may provide a novel nanostructure semiconductor light emitting device in which indium incorporation into an active layer containing indium is increased and crystal defects of the active layer are suppressed, thus allowing light emitted from the active layer to have a relatively long wavelength.

According to an exemplary embodiment of the present disclosure, a nanostructure semiconductor light emitting device may include: a base layer formed of a first conductivity-type nitride semiconductor; and a plurality of light emitting nanostructures disposed spaced apart from one another on the base layer, wherein each of the plurality of light emitting nanostructures includes a nanocore formed of the first conductivity-type nitride semiconductor; a stress control layer disposed on a surface of the nanocore and including a nitride semiconductor containing indium; an active layer disposed on the stress control layer and including a nitride semiconductor containing indium; and a second conductivity-type nitride semiconductor layer disposed on the active layer.

The stress control layer may include n number of layers containing indium, and the stress control layer may satisfy the equation $$\sum_{i=1}^{n} x_i^2 t_i > 0.12$$

where a content of indium in an i-th layer and a thickness of the i-th layer, among the layers containing indium, are expressed by $x_i$ (mole ratio) and $t_i$ (nm), respectively, and Here, n is a natural number equal to or greater than 1.

Each of the layers containing indium may satisfy the equation $$x_i^2 t_i < 0.4$$

The stress control layer may be an InGaN bulk layer. Alternatively, the stress control layer may have a superlattice structure in which first layers formed of $In_{x1}Ga_{1-x1}N$ and second layers formed of $In_{x2}Ga_{1-x2}N$ are alternatively stacked, where $x_2 < x_1 < 1$ and $0 \leq x_2 < x_1$.

The second layers may be formed of GaN. At least one of the first layers may have a content of indium different from those of the other first layers. At least one of the first layers may have a thickness different from those of the other first layers.

Each of the first layers may have a thickness ranging from 5 Å to 500 Å, and each of the second layers may have a thickness ranging from 5 Å to 500 Å.

The active layer may emit light having a peak wavelength equal to or greater than 535 nm. The active layer may have a structure in which quantum well layers formed of $In_{y1}Ga_{1-y1}N$ and quantum barrier layers formed of $In_{y2}Ga_{1-y2}N$ are alternatively stacked, where $y_2 < y_1 < 1$ and $0 \leq y_2 < y_1$. In this case, the content ($y_1$) of indium of each of the quantum well layers may be equal to or greater than 0.2.

The stress control layer may have a superlattice structure in which first layers formed of $In_{x1}Ga_{1-x1}N$ and second layers formed of $In_{x2}Ga_{1-x2}N$ are alternatively stacked, where $x_2 < x_1 < 1$ and $0 \leq x_2 < x_1$. In this case, a thickness of the first layer may be smaller than that of the quantum well layer. A thickness of the second layer may be smaller than that of the quantum barrier layer.

The content $x_1$ of indium in the first layer may be less than the content $y_1$ of indium in the quantum well layer.

The stress control layer may have a thickness ranging from 5 nm to 100 nm. The stress control layer may include a nitride layer doped with a first conductivity-type impurity.

The nanostructure semiconductor light emitting device may further include a current suppressing intermediate layer disposed between a surface of a tip portion of each nanocore and the stress control layer. The current suppressing intermediate layer may be doped with a second conductivity-type impurity or may be provided as an undoped nitride layer.

According to an exemplary embodiment of the present disclosure, a light emitting device package may include: a package board having first and second electrode structures; and the foregoing nanostructure semiconductor light emitting device mounted on the package board and electrically connected to the first and second electrode structures.

According to an exemplary embodiment of the present disclosure, a lighting device may include: the light emitting device package; a driving unit driving the light emitting device package; and an external connection unit supplying an external voltage to the driving unit.

According to an exemplary embodiment of the present disclosure, a lighting device may include: the foregoing nanostructure semiconductor light emitting device; a driving unit driving the nanostructure semiconductor light emitting device; and an external connection unit supplying an external voltage to the driving unit.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
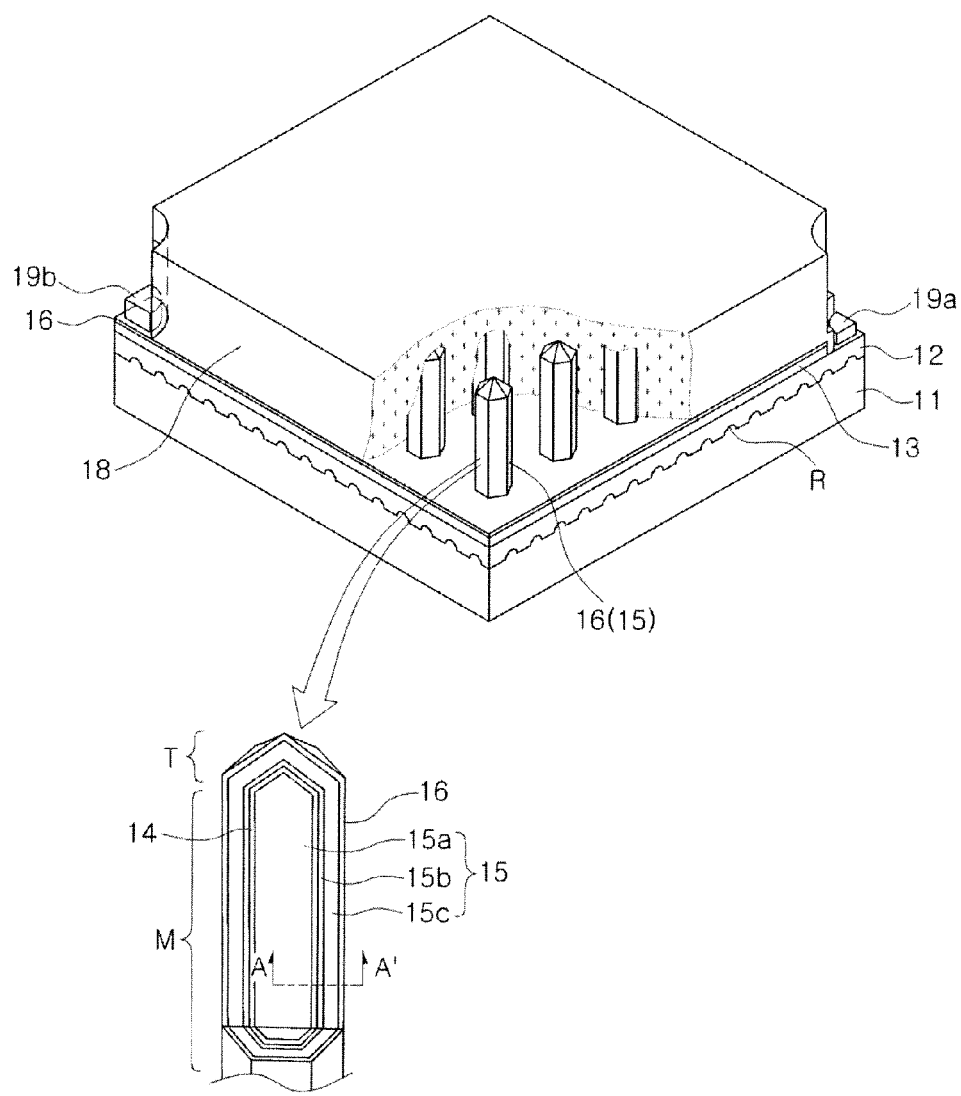
FIG. 1 is a perspective view of a nanostructure semiconductor light emitting device according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Figure 2:
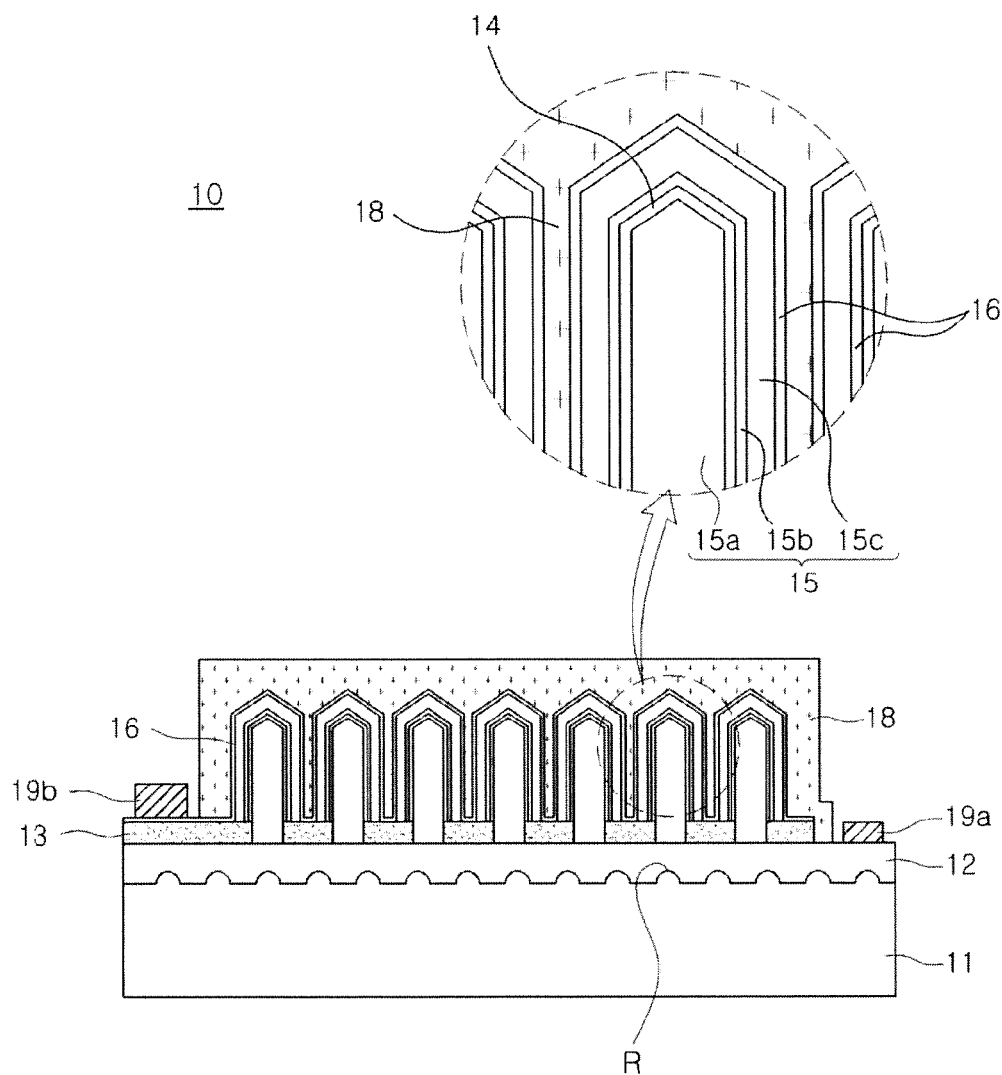
FIG. 2 is a cross-sectional view of the nanostructure semiconductor light emitting device illustrated in FIG. 1.

FIG. 1 is a perspective view schematically illustrating a nanostructure semiconductor light emitting device according to an exemplary embodiment of the present inventive concept, and FIG. 2 is a cross-sectional view illustrating the nanostructure semiconductor light emitting device illustrated in FIG. 1.

A nanostructure semiconductor light emitting device 10 illustrated in FIG. 1 includes a base layer 12 formed of a first conductivity-type semiconductor material and a plurality of light emitting nanostructures 15 formed on the base layer 12.

The nanostructure semiconductor light emitting device 10 may include a substrate 11 having an upper surface on which the base layer 12 is disposed. A depression and protrusion pattern R may be formed on the upper surface of the substrate 11. The depression and protrusion pattern R may enhance quality of a single crystal grown thereon, while improving light extraction efficiency. The substrate 11 may be an insulating, conductive, or semiconductor substrate. For example, the substrate 11 may be formed of sapphire, SiC, Si, $MgAl_2O_4$, MgO, $LiAlO_2$, $LiGaO_2$, or GaN.

The base layer 12 may include a first conductivity-type semiconductor layer and provide a growth surface of the light emitting nanostructures 15. The base layer 12 may be a nitride semiconductor satisfying $Al_xIn_yGa_{1-x-y}N$ ($0 \leq x < 1$, $0 \leq y < 1$, $0 \leq x+y < 1$) and may be doped with an n-type impurity such as silicon (Si). For example, the base layer 12 may be an n-type GaN.

An insulating layer 13 having openings may be formed on the base layer 12, and the openings may be provided to facilitate growth of the light emitting nanostructures 15 (in particular, nanocores 15a). The nanocores 15a may be formed on regions of the base layer 12 exposed by the openings. The insulating layer 13 may be used as a mask for growing the nanocores 15a. The insulating layer 13 may be formed of an insulating material such as $SiO_2$ or $SiN_x$.

The light emitting nanostructure 15 may include a main portion M having a hexagonal prism structure and a tip portion T positioned on the main portion M. The main portion M of the light emitting nanostructure 15 may have the lateral surfaces, each of which being the same crystal plane, and the tip portion T of the light emitting nanostructure 15 may have a crystal plane different from that of the lateral surfaces of the light emitting nanostructure 15. The tip portion T of the light emitting nanostructure 15 may have a hexagonal pyramid shape. Such a division of the nanostructure may be determined by the nanocore 15a in actuality, and the nanocore 15a may be divided into the main portion M and the tip portion T.

The light emitting nanostructure 15 may include the nanocore 15a formed of a first conductivity-type nitride semiconductor and an active layer 15b and a second conductivity-type nitride semiconductor layer 15c sequentially formed on a surface of the nanocore 15a. The nanocore 15a may be a nitride semiconductor satisfying $Al_xIn_yGa_{1-x-y}N$ ($0 \le x < 1$, $0 \le y < 1$, $0 \le x+y < 1$) similar to that of the base layer 12. For example, the nanocore 15a may be formed of n-type GaN. The active layer 15b employed in the present exemplary embodiment may have a nitride semiconductor containing indium (In). The active layer 15b may have a multi-quantum well (MQW) structure in which quantum well layers formed of $In_{y1}Ga_{1-y1}N$ and quantum barrier layers formed of $In_{y2}Ga_{1-y2}N$ are alternately stacked, where $y_2 < y_1 < 1$ and $0 \le y_2 < y_1$. For example, the active layer 15b may have a GaN/InGaN MQW structure. If necessary, the active layer 15b may also have a single quantum well (SQW) structure containing indium. The second conductivity-type nitride semiconductor layer 15c may be a crystal satisfying p-type $Al_xIn_yGa_{1-x-y}N$ ($0 \le x < 1$, $0 \le y < 1$, $0 \le x+y < 1$) and, if necessary, the second conductivity-type nitride semiconductor layer 15c may include a plurality of layers.

The light emitting nanostructure 15 employed in the present exemplary embodiment may further include a stress control layer 14 having a nitride semiconductor containing indium. The stress control layer 14 may be disposed between the nanocore 15a and the active layer 15b to alleviate stress due to a difference in lattice constants. When stress exists between the nanocore 15a and the active layer 15b due to a difference in lattice constants, a defect such as a stacking fault may be generated in the active layer 15b and indium may not be easily incorporated in the active layer 15b. In particular, the low indium incorporation rate may make it difficult to obtain light having a relatively long wavelength (e.g., having a peak wavelength of 535 nm or greater) from the active layer 15b. In the present exemplary embodiment, the stress control layer 14 containing indium may be introduced between the nanocore 15a and the active layer 15b to alleviate stress, thereby providing an environment allowing for an increase in indium incorporation in the active layer, as well as improving crystal quality.

Figure 3:
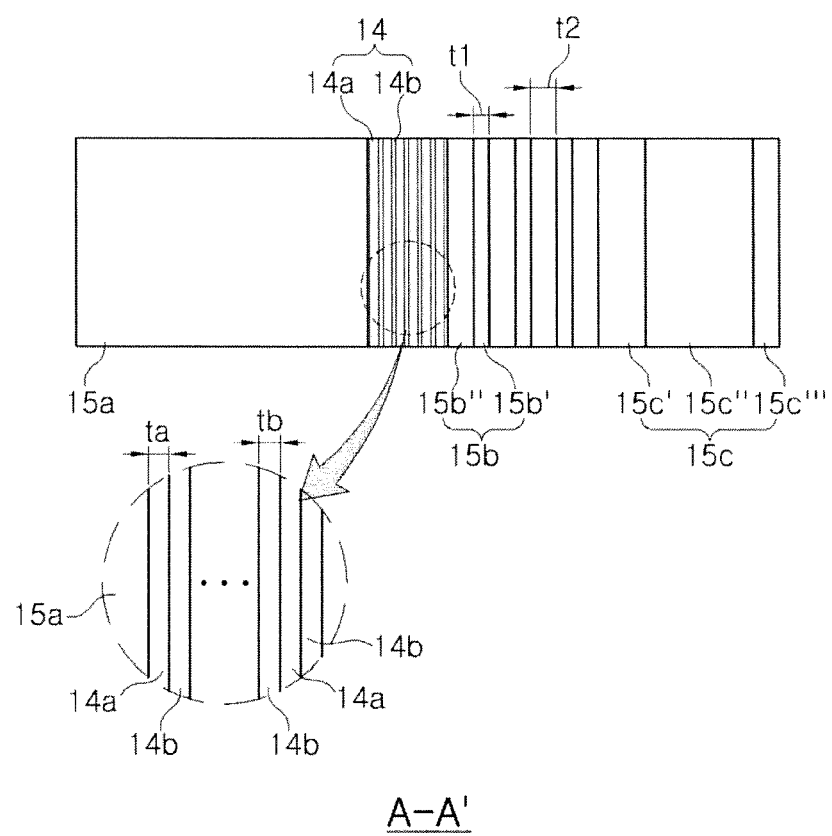
FIG. 3 is a schematic view illustrating a stacking structure A-A' in the nanostructure semiconductor light emitting device illustrated in FIGS. 1 and 2.

A specific example of a stacking structure in the light emitting nanostructure 15 employed in the present exemplary embodiment is illustrated in FIG. 3. FIG. 3 is a schematic view illustrating a portion A-A' of FIGS. 1 and 2.

Referring to the example of the stacking structure illustrated in FIG. 3, the nanocore 15a is n-type GaN and the active layer 15b may have a multi-quantum well (MQW) structure in which quantum well layers 15b' formed of $In_{y1}Ga_{1-y1}N$ and quantum barrier layer 15b'' formed of $In_{y2}Ga_{1-y2}N$ are alternately stacked, where $y_2 < y_1 < 1$ and $0 \le y_2 < y_1$. The quantum barrier layers 15b'' may be formed of GaN. The stress control layer 14 may be formed between the nanocore 15a formed of n-type GaN and the quantum barrier layer 15b'' containing indium (In). As illustrated in FIG. 3, the stress control layer 14 may have a superlattice structure in which first layers 14a formed of $In_{x1}Ga_{1-x1}N$ and second layers 14b formed of $In_{x2}Ga_{1-x2}N$ are alternately stacked, where $x_2 < x_1 < 1$ and $0 \le x_2 < x_1$. The second layer 14b may disperse stress due to the first layer 14a having a relatively large amount of indium (In), and thus, an overall thickness (for example, the number of layers) of the first layer 14a may be increased. For example, the second layer 14b may be a GaN layer. GaN of the stress control layer 14 may not greatly affect controlling of strain energy, but if the thickness of the GaN layer is excessively increased, a stress alleviation effect of InGaN may be reduced.

A thickness ta of the first layer 14a may range from 5 Å to 500 Å, and a thickness tb of the second layer 14b may range from 5 Å to 500 Å. But, the thicknesses of the first and second layers are not limited thereto.

In a specific example, the thickness ta of the first layer 14a may be smaller than a thickness t1 of the quantum well layer 15b'. The thickness tb of the second layer 14b may be smaller than a thickness t2 of the quantum barrier layer 15b''.

The above structure in the present exemplary embodiment may be advantageously used in a case in which a high composition ratio of indium is required. For example, the active layer 15b may have the quantum well layers 15b' emitting light having a relatively long wavelength such as green light, yellow light, or red light. A content $y_1$ of indium in the quantum well layer 15b' may be 0.2 or higher. A content $x_1$ of indium in the first layer 14a may be lower than the content y of indium in the quantum well layer 15b.

The stress control layer 14 may be doped with a first conductivity-type impurity (e.g., an n-type impurity). The impurity doping may distinguish the stress control layer 14 alleviating stress for the active layer 15b without contributing to the emission of light from the active layer 15b contributing to the emission of light.

The second conductivity-type nitride semiconductor layer 15c may include a p-type AlGaN layer 15c' provided as an electron blocking layer (EBL), a p-type GaN layer 15c'' having a low impurity concentration and a p-type GaN layer 15c''' having a high impurity concentration. The p-type AlGaN layer 15c' and the p-type GaN layer 15c''' having a high impurity concentration may be provided as an electron blocking layer (EBL) and a contact layer, respectively.

The nanostructure semiconductor light emitting device 10 may include a contact electrode 16 connected to the second conductivity-type nitride semiconductor layer 15c. The contact electrode 16 employed in the present exemplary embodiment may be formed of a transparent conductive material. The contact electrode 16 may be any one of a transparent conductive oxide layer or a transparent conductive nitride layer to emit light toward the light emitting nanostructures (in a direction opposite to the substrate). For example, the contact electrode 16 may include at least one selected from among indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($ZN_{(1-x)}Mg_xO$) ($0 \le x \le 1$). If necessary, the contact electrode 16 may include graphene.

The material of the contact electrode 16 is not limited thereto, and the contact electrode 16 may include at least one of silver (Ag), nickel (Ni), aluminum (Al), rhodium (Rh), palladium (Pd), iridium (Ir), ruthenium (Ru), magnesium (Mg), zinc (Zn), platinum (Pt), and gold (Au), and may be provided as a structure including two or more layers such as Ni/Ag, Zn/Ag, Ni/Al, Zn/Al, Pd/Ag, Pd/Al, Ir/Ag. Ir/Au, Pt/Ag, Pt/Al, or Ni/Ag/Pt.

If necessary, the contact electrode 16 may be provided as a reflective electrode structure to form a flip-chip structure.

An insulating protective layer 18 may be formed on upper surfaces of the light emitting nanostructures 15. The insulating protective layer 18 may be a passivation layer for protecting the light emitting nanostructures 15. Also, the insulating protective layer 18 may be formed of a light transmissive material allowing light generated by the light emitting nanostructures 15 to be extracted. In this case, the insulating protective layer 18 may be formed of a material having an appropriate refractive index to enhance light extraction efficiency.

As in the present exemplary embodiment, after the contact electrode 16 is formed, spaces between the plurality of light emitting nanostructures may be filled with the insulating protective layer 18. As a material of the insulating protective layer 18, an insulating material such as $SiO_2$ or $SiN_X$ may be used. For example, as a material of the insulating protective layer 18, tetraethyl orthosilicate (TEOS), borophospho silicate glass (BPSG), CVD-$SiO_2$, spin-on glass (SOG), or spin-on dielectric (SOD) may be used.

A means for filling the spaces between the light emitting nanostructures 15 is not limited to the insulating protective layer 18. For example, in another exemplary embodiment (please refer to FIG. 16A), the spaces between the light emitting nanostructures 15 may be filled with an electrode element such as a contact electrode.

The nanostructure semiconductor light emitting device 10 may include first and second electrodes 19a and 19b. The first electrode 19a may be disposed on an exposed region of the base layer 12 formed of the first conductivity-type semiconductor. Also, the second electrode 19b may be disposed on an exposed portion of an extended region of the contact electrode 16. The arrangement of the electrodes is not limited thereto, and various arrangements thereof may be provided according to use environments.

In the exemplary embodiment illustrated in FIGS. 1 through 3, the stress control layer 14 is illustrated as having a superlattice structure in which the first and second layers are alternately stacked, but it may be modified into various other structures. FIGS. 4A through 4D illustrate stress control layers having various structures employable in the present exemplary embodiment.

Figure 4A:
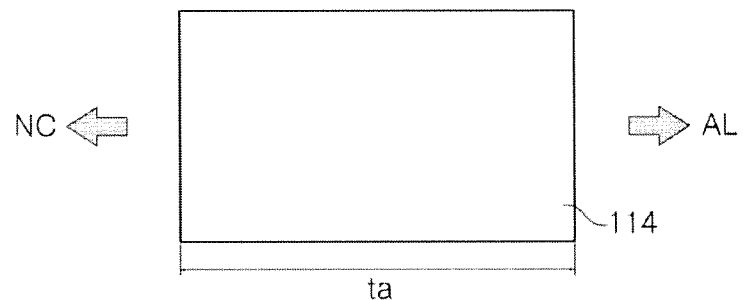
FIGS. 4A to 4D are front elevation views illustrating various examples of stress control layers employable in the nanostructure semiconductor light emitting device according to an exemplary embodiment of the present disclosure.

Referring to FIG. 4A, an InGaN bulk layer 114 is illustrated as an example of a nitride layer containing indium. The InGaN bulk layer 114 may be a single bulk providing energy required for alleviating stress. The content of indium may be uniform in the entire region of the InGaN bulk layer 114, or may be sloped according to growth direction. For example, the content of indium may increase in a direction from the interior of the InGaN bulk layer 114 toward the active layer AL. Conversely, the content of indium in the InGaN bulk layer 114 may increase in a direction toward the nanocore NC.

Figure 4B:
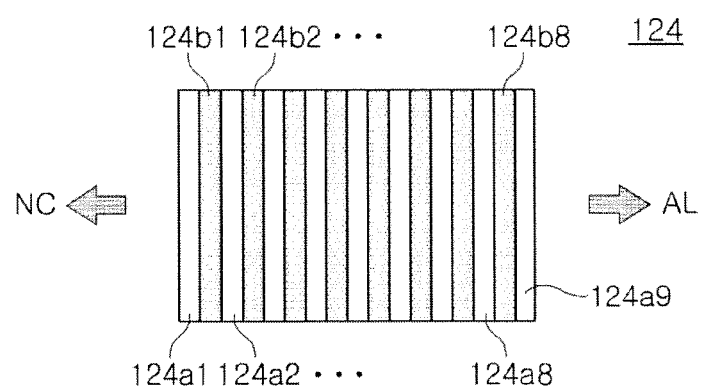

Referring to FIG. 4B, a stress control layer 124 may have a superlattice structure in which first layers 124a1-124a9 formed of $In_xGa_{1-x}N$ (0<x<1) and second layers 124b1-124b8 formed of GaN are alternately stacked.

At least some of the first layers 124a1-124a9 may have different contents of indium. For example, a first layer adjacent to the active layer AL may have a relatively high content of indium or a first layer adjacent to the nanocore NC may have a relatively low content of indium. In another example, the plurality of first layers 124a1-124a9 may be arranged such that the content of indium is gradually increased or decreased. For example, as the first layer 124a1-124a9 is closer to the active layer AL, it has a higher content of indium.

Figure 4C:
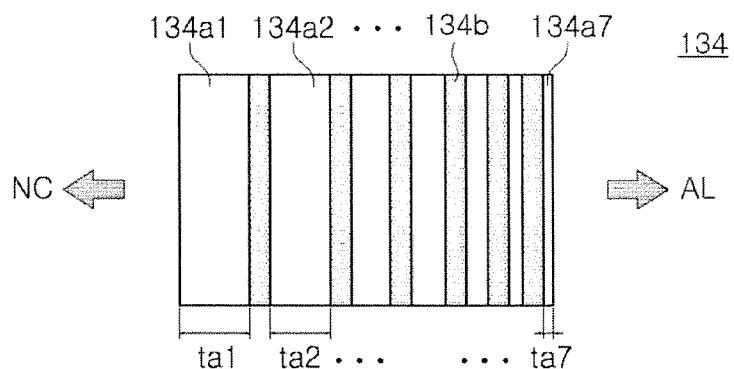

Referring to FIG. 4C, a stress control layer 134 may have a superlattice structure in which first layers 134a1-134a7 formed of $In_{x1}Ga_{1-x1}N$ (0<x<1) and second layers 134b formed of GaN are alternately stacked.

At least some of the first layers 134a1-134a7 may have different thicknesses. As illustrated in FIG. 4C, the first layers 134a1-134a7 may be arranged such that thicknesses thereof are gradually decreased (ta1>ta2>ta3 . . . >ta7). Conversely, the first layers 134a1-134a7 may be arranged such that thicknesses thereof are gradually increased. Alternatively, at least some of the second layers 134b may have different thicknesses.

Figure 4D:
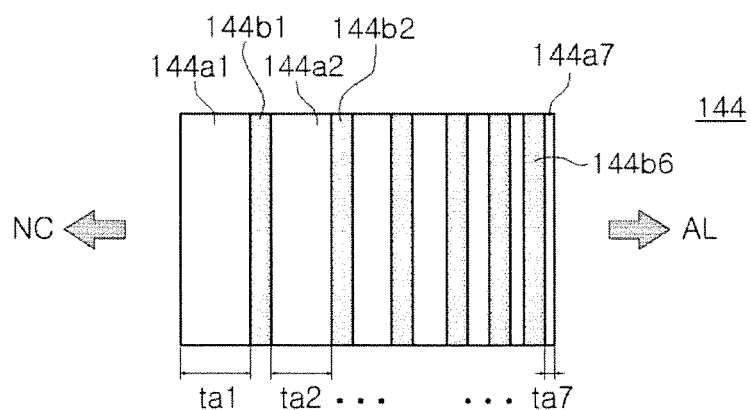

Referring to FIG. 4D, a stress control layer 144 may have a superlattice structure in which first layers 144a formed of $In_{x1}Ga_{1-x1}N$ and second layers 144b formed of $In_{x2}Ga_{1-x2}N$ are alternately stacked, where $x_2<x_1<1$ and $0<x_2<x_1$. Namely, both the first layers 144a and the second layers 144b may contain indium.

Similar to that of the previous exemplary embodiment, the first layers 144a1-144a7 may be arranged such that thicknesses thereof are gradually decreased (ta1>ta2>ta3 . . . >ta7). Conversely, the first layers 144a1-144a7 may be arranged such that thicknesses thereof are gradually increased, and the second layers 144b1-144b6 may be formed to have different content of indium, as illustrated in FIG. 4B.

In the superlattice structure excluding the example illustrated in FIG. 4A, the thicknesses of the first layers may range from 5 Å to 500 Å, and the thicknesses of the second layers may range from 5 Å to 500 Å, The content of indium in the first layers may be lower than that in the quantum well layers. The stress control layer may be doped with a first conductivity-type impurity (e.g., an n-type impurity). The impurity doping may distinguish the active layer contributing to the emission of light and the stress control layer not contributing to the emission of light.

In order to ascertain the operations and effects on the basis of the presence of the stress control layer employed in the present exemplary embodiment, an experiment was conducted.

Figure 5:
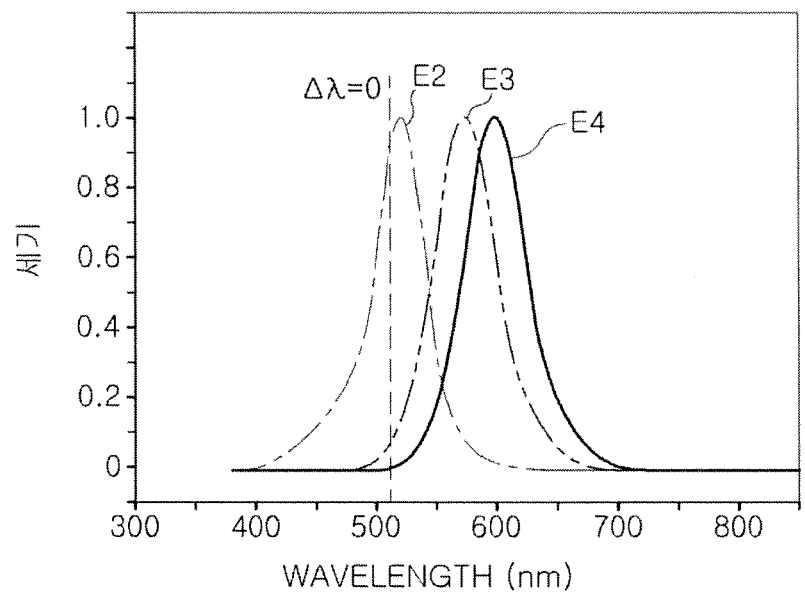
FIG. 5 is a graph illustrating spectrums of light emitted from active layers on the basis of the characteristics of stress control layers according to specific experimental examples of the present disclosure.

FIG. 5 is a graph illustrating spectrums of light emitted from active layers on the basis of the characteristics of stress control layers according to a specific experimental example of the present inventive concept.

Light emitting nanostructures were manufactured under the same conditions. At this time, as a stress control layer between each nanocore and each active layer, ten pairs of first layers formed of $In_{0.18}Ga_{0.82}N$ and second layers formed of GaN as those illustrated in FIG. 3 were alternately stacked. The thicknesses of the second layers were maintained to be equal, while the thicknesses of the first layers were varied as illustrated in Table 1. In order to evaluate strain energy due to the stress control layers introduced to respective samples, the following equation (1) was used:

$$\sum_{i=1}^{n} x_i^2 t_i > 0.12 \qquad \text{Equation (1)}$$

In equation (1), n denotes the number of layers containing indium employed in the stress control layer, and the content of indium in an i-th layer and a thickness of the i-th layer among the layers containing indium are denoted by x (mole ratio) and $t_i$ (nm), respectively. Here, n is a natural number equal to or greater than 1. Strain energy controlled by samples E1 to E4 calculated by using equation (1) are shown in Table 1.

TABLE 1

| Classification | E1 | E2 | E3 | E4 |
| --- | --- | --- | --- | --- |
| Thickness of First Layer (nm) | 0.36 | 0.72 | 2.16 | 3.6 |
| Strain Energy by Equation (1) | 0.12 | 0.23 | 0.70 | 1.17 |

In each sample, the layers, excluding the stress control layer, were formed by using the same growth process. In a reference sample Ref, an active layer was formed under the same growth conditions as those of the other samples E1 to E4, except that the active layer was formed without a stress control layer. Spectrums of light emitted from the reference sample Ref and the other samples E1 to E4 were measured. Characteristics of light obtained from respective samples are illustrated in Table 2 and spectrums of light emitted from respective samples are illustrated in the graph of FIG. 5.

TABLE 2

| Classification | Ref. | E1 | E2 | E3 | E4 |
| --- | --- | --- | --- | --- | --- |
| Peak Wavelength (nm) | 520 | 521 | 524 | 566 | 597 |
| FWHM (nm) | — | — | 34 | 41 | 52 |

Referring to FIG. 5 together with Table 2, it can be seen that wavelength characteristics of light emitted from sample E1 were rarely changed, compared with the reference sample in which no stress control layer was employed, while a peak wavelength of light emitted from sample E2 was slightly increased, and peak wavelengths of light emitted from sample E3 and sample E4 were considerably increased by about 46 nm and about 77 nm, respectively. In this manner, when the stress control layer is introduced before the growth of the active layer, an indium incorporation rate may be increased, relative to the indium incorporation rate of the active layer grown under the same conditions without a stress control layer. As a result, light having a relatively long wavelength may be emitted. The effect of the stress control layer is proportional to strain energy due to the stress control layer, and such strain energy may be evaluated in consideration of the content (x) of indium in each layer containing indium and the thickness t of the corresponding layer containing indium. Thus, conditions for producing light having a sufficiently long wavelength may be obtained using evaluation values of strain energy according to equation (1).

Figure 6:
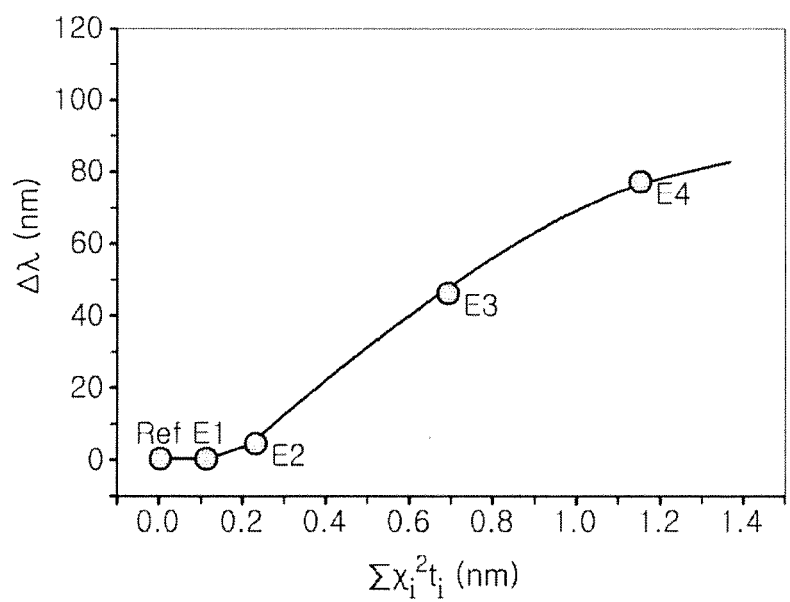
FIG. 6 is a graph illustrating variations in wavelengths of light emitted from active layers on the basis of the characteristics of stress control layers according to specific experimental examples of the present disclosure.

FIG. 6 is a graph illustrating variations in wavelengths of light emitted from samples E1 to E4 compared with the reference sample based on the evaluation values of the samples obtained by using Equation (1). As illustrated in FIG. 6, according to the experimental results, it can be seen that, when the evaluation value of strain energy according to equation (1) is greater than 0.12 (E1), further, when it is equal to or greater than 0.20, a sufficient long wavelength effect may be expected. A structure (e.g., the number of layers containing indium) of a stress control layer, and the content of indium in each layer and the thickness of each layer may be designed to satisfy the evaluation value.

Thus, the introduction of the stress control layer may be advantageously used to prepare an active layer that emits light of a peak wavelength equal to or higher than 535 nm such as green, yellow, or red light. Namely, the finally obtained active layer may have a high content of indium equal to or greater than 0.2.

Figure 7A:
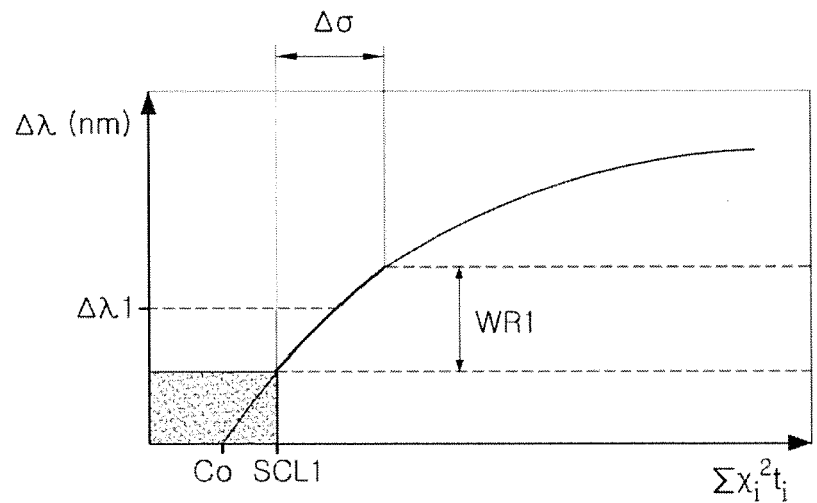
FIGS. 7A and 7B are graphs illustrating changes in light emitted from active layers on the basis of the characteristics of stress control layers.
Figure 7B:
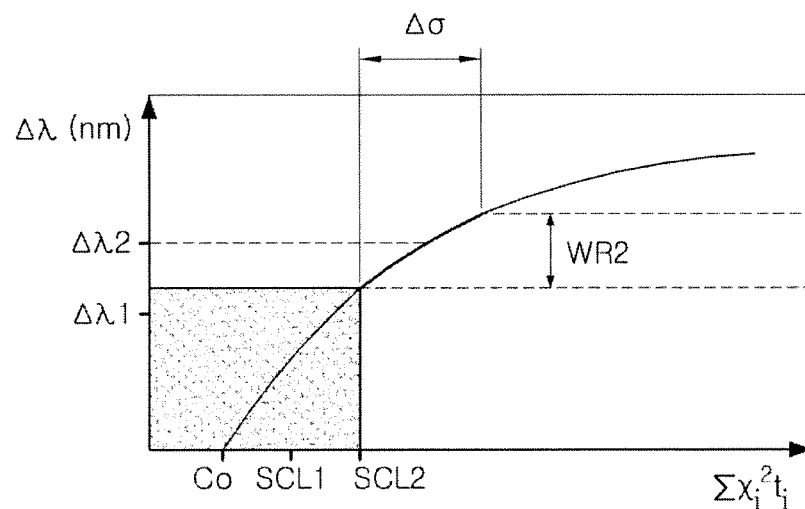

FIGS. 7A and 7B are graphs illustrating changes in light emitted from active layers based on the evaluation values of strain energy of stress control layers obtained in equation (1).

Referring to FIG. 7A, a wavelength of light is not changed even when the evaluation value obtained in equation (1) increases, and the wavelength is changed when it reaches a threshold value Co. The evaluation value of the stress control layer illustrated in FIG. 7A has a value SCL1 greater than the threshold value Co and light emitted from the active layer grown on the stress control layer may have a relatively longer wavelength.

In addition, an effect of controlling stress by the active layer may also be taken into consideration. Since the active layer introduced in this example has a GaN/InGaN MQW structure, it has an effect of alleviating stress similar to that of the stress control layer according to the content of indium, and thus, as a quantum well layer among the quantum well layers of the active layer is formed late, it may emit light having a longer wavelength. An increment in a wavelength of light emitted from the overall quantum well layers may be distributed within a predetermined range WR1. Referring to FIG. 7A, since the active layer having the MQW structure containing indium also has an increment (Δσ) in the evaluation value obtained by using equation (1), the effect of additionally lengthening the wavelength of light emitted from the active layer may be obtained. Namely, the light emitted from the active layer may have a wavelength variation (Δλ1) greater than the actual wavelength variation obtained by the stress control layer.

FIG. 7B is a graph illustrating results obtained by introducing a stress control layer having an evaluation value SCL2 of strain energy greater than that of the stress control layer employed in FIG. 7A, and here, the stress control layer is formed under the same conditions as those of FIG. 7A, except for the above condition. Light emitted from the active layer has a wavelength variation (Δλ2>Δλ1) greater than that of the result of FIG. 7A. It can be seen that an increment in a wavelength of light emitted from the overall quantum well layers according to the stress alleviation effect of the quantum well layers is distributed in a predetermined range WR2.

In this manner, the stress control layer may include an indium containing layer as a single bulk or a plurality of indium containing layers, and crystallinity of the active layer may be improved and an indium incorporation rate of the active layer may be increased using the evaluation values of strain energy on the basis of the content of indium in each layer and the thickness of each layer. In this case, however, the content of indium in each layer and the thickness of each layer may be controlled such that strain energy is not greatly generated within the indium containing layers constituting the stress control layer. The content of indium in an i-th layer and the thickness of the i-th layer, among the indium containing layers, may be controlled to satisfy the following equation (2):

$$x_i^2 t_i < 0.4 \qquad \text{Equation (2)}$$

An example of a method for manufacturing a nanostructure semiconductor light emitting device according to an exemplary embodiment is illustrated in FIGS. 8A through 8E.

Figure 8A:
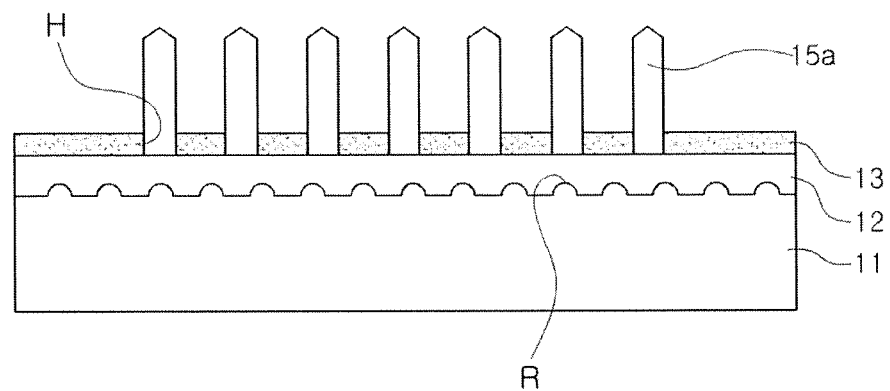
FIGS. 8A through 8E are cross-sectional front elevation views illustrating an example of a method for manufacturing a nanostructure semiconductor light emitting device according to an exemplary embodiment of the present disclosure.

As illustrated in FIG. 8A, a plurality of nanocores 15a may be formed on a base layer 12 formed of a first conductivity-type nitride semiconductor.

An upper surface of a substrate 11 may be provided with a depression and protrusion pattern R. The base layer 12 may be formed on the upper surface of the substrate 11. An insulating layer 13 having openings H may be formed on the base layer 12. The nanocores 15a formed of a first conductivity-type nitride semiconductor may be selectively grown on regions of the base layer 12 exposed through the openings H by using the insulating layer 13 as a mask.

Figure 8B:
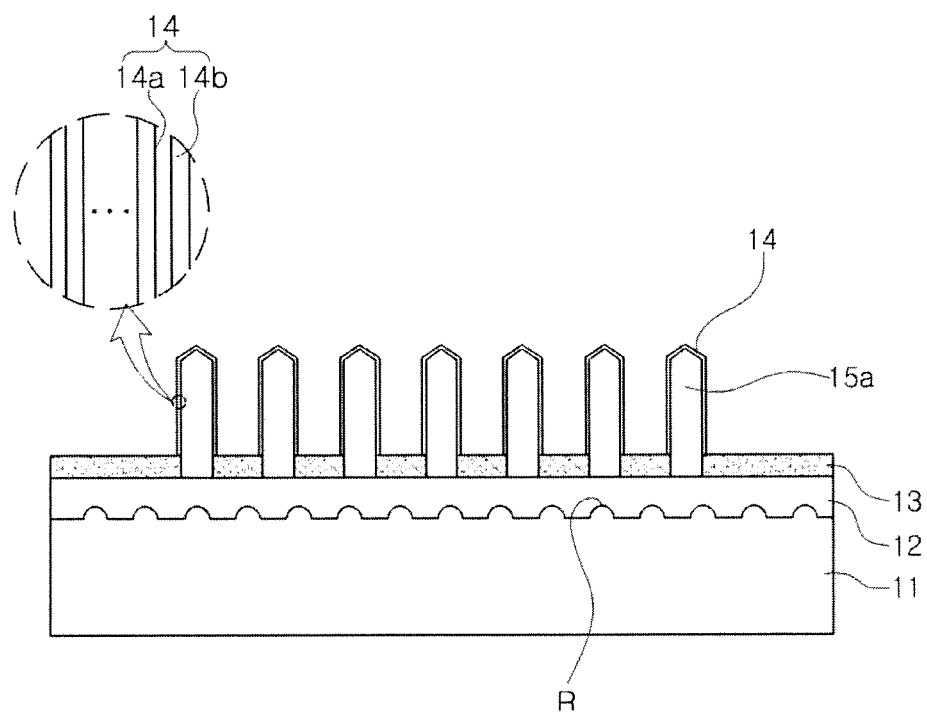

Thereafter, as illustrated in FIG. 8B, a stress control layer 14 may be formed on surfaces of the plurality of nanocores 15a.

The stress control layer 14 may be obtained through a process of growing nitride layers containing indium (In). In the present exemplary embodiment, the stress control layer 14 may be provided as having a superlattice structure formed by alternately growing first layers 14a formed of $In_{x1}Ga_{1-x1}N$ and second layers 14b formed of $In_{x2}Ga_{1-x2}N$, where $x_2<x_1<1$ and $0\le x_2<x_1$. For example, the second layer 14b may be a GaN layer. In this case, a desired stress alleviation effect (relatively longer wavelength) may be adjusted by appropriately selecting the content ($x_1$) of indium in the first layer 14a, the thickness of the first layer, and the number of first layers. The stress control layer 14 may be doped with a first conductivity-type impurity (e.g., an n-type impurity). The impurity doping may distinguish the stress control layer 14 from the active layer that contributes to the emission of light.

Figure 8C:
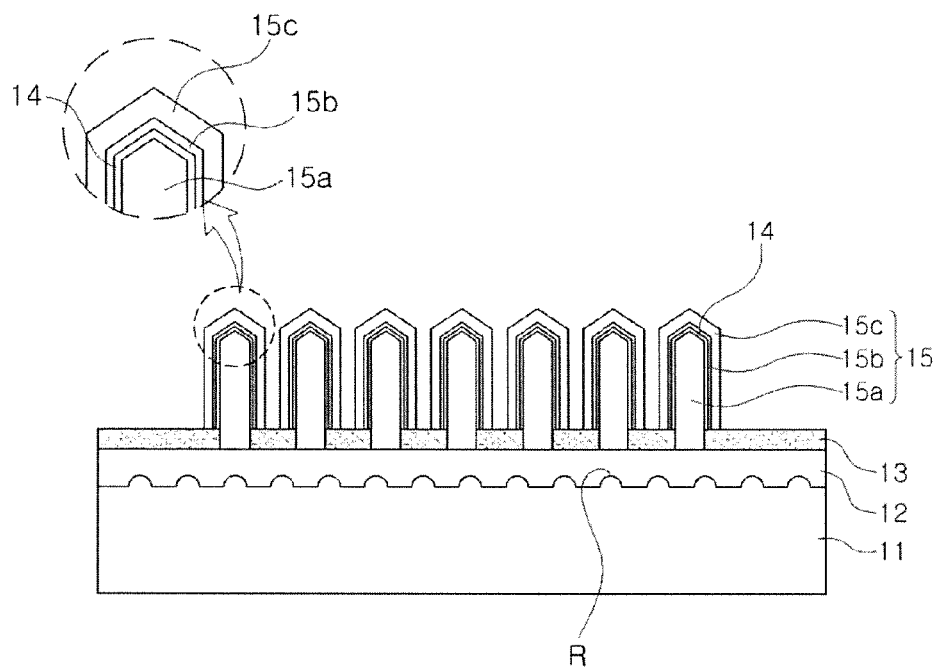

Subsequently, as illustrated in FIG. 8C, an active layer 15b and a second conductivity-type nitride semiconductor layer 15c may be sequentially formed on the stress control layer 14.

Through this process, a plurality of light emitting nanostructures 15 may be formed. The active layer 15b may have a multi-quantum well (MQW) structure in which quantum well layers and quantum barrier layers are alternately stacked. For example, the active layer 15b may have a GaN/InGaN MQW structure. If necessary, the active layer 15b may have a single quantum well (SQW) structure. The second conductivity-type nitride semiconductor layer 15c may be a crystal satisfying p-type $Al_xIn_yGa_{1-x-y}N$ ($0\le x<1$, $0\le y<1$, $0\le x+y<1$) and may be provided as a plurality of layers as needed.

The above structure in the present exemplary embodiment may be advantageously used in the active layer 15b requiring a high indium incorporation rate. For example, the active layer 15b may be configured to emit light having a relatively long wavelength such as green light, yellow light, or red light. For example, the active layer 15b may have the content of indium equal to or higher than 0.2. The content of indium in the quantum wall layer may be higher than the content $x_1$ of indium in the first layer 14a.

Figure 8D:
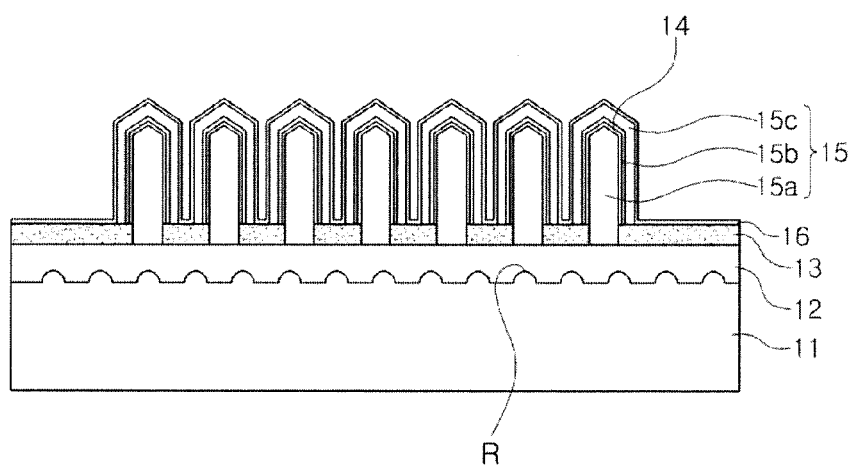

Thereafter, as illustrated in FIG. 8D, a contact electrode 16 may be formed on the light emitting nanostructures 15.

The contact electrode 16 may be formed on a surface of the second conductivity-type nitride semiconductor layer 15c. The contact electrode 16 employed in the present exemplary embodiment may be formed of a transparent conductive material, but is not limited thereto. The contact electrode 16 may be either a transparent conductive oxide layer or nitride layer. For example, the contact electrode 16 may be at least one selected from among ITO, ZITO, ZIO, GIO, ZTO, FTO, AZO, GZO, $In_4Sn_3O_{12}$, and $ZN_{(1-x)}Mg_xO$. If necessary, the contact electrode 16 may be formed of a reflective electrode material.

Figure 8E:
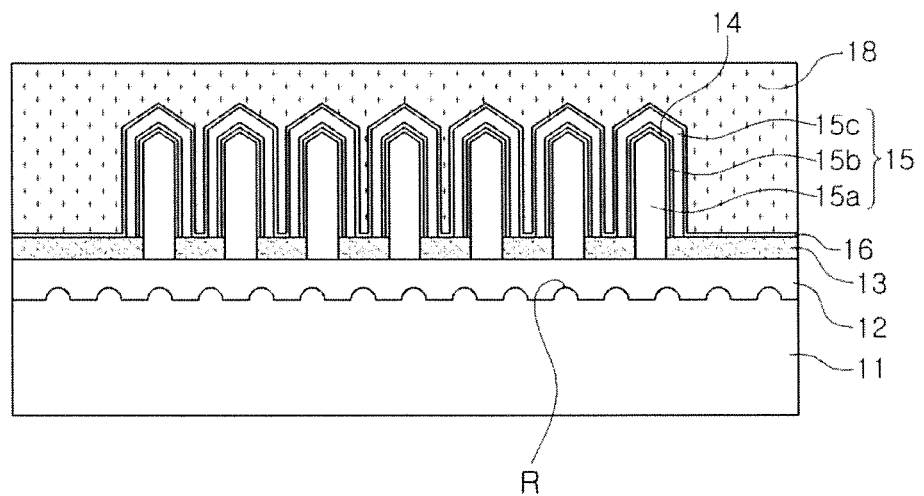

Subsequently, as illustrated in FIG. 8E, an insulating protective layer 18 may be formed to fill spaces between the light emitting nanostructures 15.

The insulating protective layer 18 may be formed of a light-transmissive material. The insulating protective layer 18 may be formed through a deposition process such as a chemical vapor deposition (CVD) process or a physical vapor deposition (PVD) process, a spin process, a reflowing process, and the like. For example, the insulating protective layer 18 may be formed of TEOS, BPSG, $CVD-SiO_2$, SOG, or SOD. Alternatively, the insulating protective layer 18 may be an epoxy resin, a silicon resin, or a light-transmissive resin selected from among polyethylene and polycarbonate.

Figure 9A:
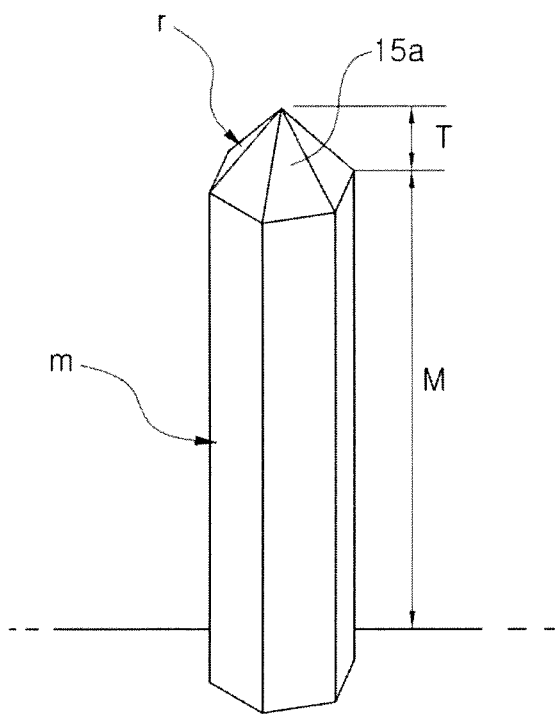
FIGS. 9A and 9B are perspective views schematically illustrating examples of a nanocore employed in an exemplary embodiment of the present disclosure.

FIG. 9A is a perspective view schematically illustrating an example of the nanocore 15a employed in the present exemplary embodiment.

As illustrated in FIG. 9A, the nanocore 15a may be divided into a main portion M providing a lateral surface having a first crystal plane and a tip portion T providing a surface having a second crystal plane different from the first crystal plane. The nanocore 15a may have a hexagonal crystal system such as a nitride single crystal. The first crystal plane may be an m-plane which is non-polar and the second crystal plane may be an r-plane which is semi-polar. In the process (FIG. 8C) of forming the active layer, the first crystal plane which is non-polar may be provided as a main region for use in forming an active layer. However, the non-polar m plane tends to have a low indium incorporation rate, relative to a polar plane or a semi-polar plane, having a difficulty in employing an active layer producing light having a relatively long wavelength. Thus, the stress control layer 14 may be advantageously used to compensate for the disadvantageous characteristics of the non-polar plane of the nanocore 15a.

Figure 9B:
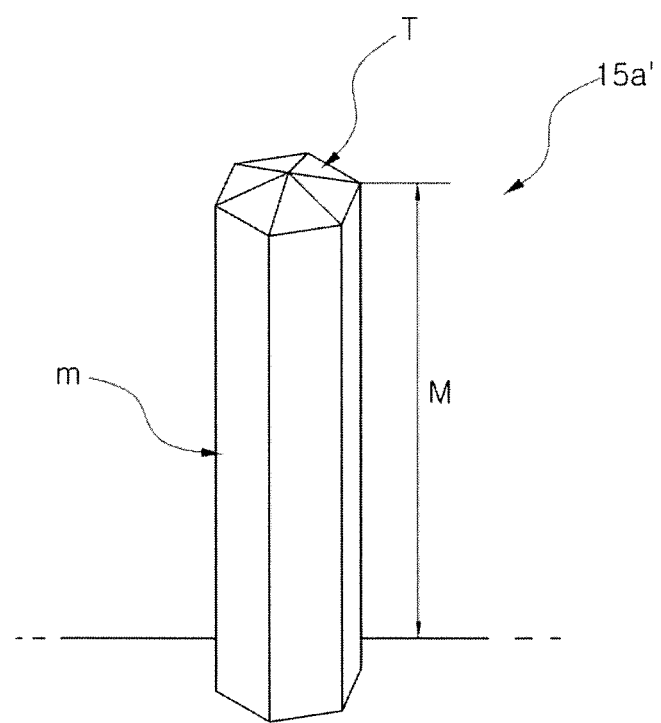

Besides the nanocore 15a illustrated in FIG. 9A, the stress control layer may be advantageously applied to nanocores having various other crystal structures and shapes. A nanocore 15a' illustrated in FIG. 9B is illustrated as having a tip portion T which does not have a non-polar plane. Similar to that of FIG. 9A, the nanocore 15a' has a main portion M having an m-plane which is non-polar, and in this structure, the stress control layer 14 may be advantageously used.

The nanostructure semiconductor light emitting device according to the present exemplary embodiment may be manufactured through various manufacturing methods. FIGS. 10A through 10G illustrate an example of a method for manufacturing a nanostructure semiconductor light emitting device, in which a mask is used as a mold structure and nanocores are grown by filling spaces in the mask. This process may be understood as replacing the process of forming light emitting nanostructures illustrated in FIGS. 8A and 8B.

Figure 10A:
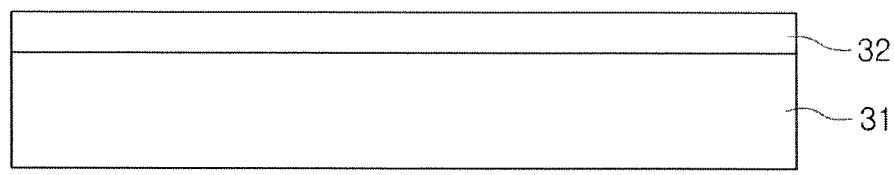
FIGS. 10A through 10G are cross-sectional front elevation views illustrating an example of a method for manufacturing a nanostructure semiconductor light emitting device according to an exemplary embodiment of the present disclosure.

As illustrated in FIG. 10A, a first conductivity-type nitride semiconductor may be grown on a substrate 31 to provide a base layer 32.

The base layer 32 provides a crystal growth surface for growing light emitting nanostructures and serves to electrically connect the light emitting nanostructures. Thus, the base layer 32 may be formed as a semiconductor single crystal having electrical conductivity. When the base layer 32 is grown directly on the substrate, the substrate 31 may be a crystal growth substrate. Before the base layer 32 is grown, a multilayer structure including a buffer layer formed of $Al_x In_y Ga_{1-x-y}N$ ($0\le x\le1$, $0\le y\le1$, $0\le x+y\le1$) may be additionally formed on the substrate 31. The multilayer structure may include intermediate layers including an undoped GaN layer and AlGaN layer or a combination thereof, so as to prevent current leakage to the buffer layer from the base layer 32 and enhance crystal quality of the base layer 32.

Figure 10B:
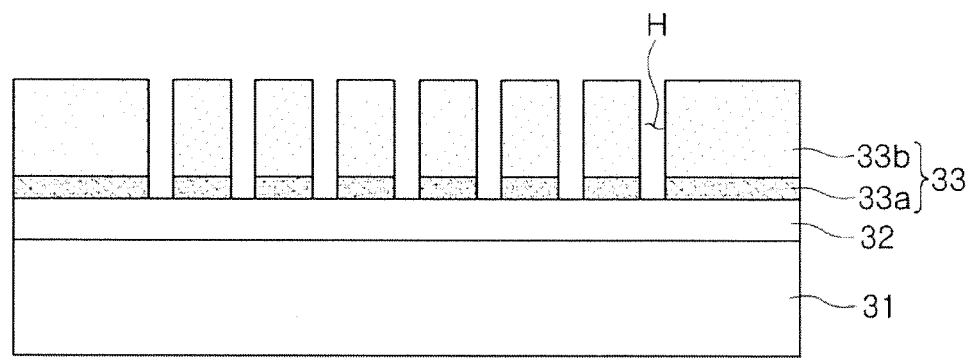

Subsequently, as illustrated in FIG. 10B, a mask 33 having a plurality of openings H and including an etch-stop layer may be formed on the base layer 32.

The mask 33 employed in the present exemplary embodiment may include a first material layer 33a formed on the base layer 32 and a second material layer 33b formed on the first material layer 33a and having an etching rate higher than that of the first material layer 33a.

The first material layer 33a may be provided as the etch-stop layer. Namely, the etching rate of the first material layer 33a may be lower than that of the second material layer 33b under the same etching conditions. At least the first material layer 33a may be formed of a material having electrical insulating properties, and the second material layer 33b may also be formed of an insulating material as needed.

The first and second material layers 33a and 33b may be formed of different materials to obtain a desired difference in etching rates. For example, the first material layer 33a may be formed of a SiN-based material, while the second material layer 33b may be formed of $SiO_2$. Alternatively, such a difference in etching rates may be obtained using pore density. The second material layer 33b or both the first and second material layers 33a and 33b may be formed of a porous material, and a difference in etching rates between the first and second material layers 33a and 33b may be secured by adjusting a difference in porosity. In this case, the first and second material layers 33a and 33b may be formed of the same material. For example, the first material layer 33a may be formed of $SiO_2$ having a first porosity and the second material layer 33b may be formed of the same material, $SiO_2$, as that of the first material layer 33a, but having a second porosity higher than the first porosity. Accordingly, under conditions under which the second material layer 33b is etched, the first material layer 33a may be retained.

A total thickness of the first and second material layers 33a and 33b may be designed in consideration of a desired height of a light emitting nanostructure. For example, a height of the mask 33 may be equal to or higher than that of a lateral surface of the nanocore. An etch stop level by the first material layer 33a may be designed in consideration of a total height of the mask 33 from the surface of the base layer 32. After the first and second material layers 33a and 33b are sequentially formed on the base layer 32, a plurality of openings H may be formed to expose regions of the base layer 32. The openings H may be obtained by forming photoresist on the mask layer 33 and performing lithography and wet/dry etching thereon. A size of each opening H may be designed in consideration of a size of a desired light emitting nanostructure. For example, a width (diameter) of each opening H exposing the surface of the base layer 32 may be equal to or smaller than 600 nm, and further may range from 50 nm to 500 nm.

The openings H may be formed using a semiconductor process, and for example, the openings H having a high aspect ratio may be formed using a deep-etching process. The aspect ratio of the opening H may be equal to or greater than 5:1, further, equal to or greater than 10:1.

While varied depending on etch conditions, in general, the width of each opening H in the first and second material layers 33a and 33b may be decreased in a direction toward the base layer 32.

In general, dry etching is performed by using a deep-etching process, and reactive ions generated from plasma or ion beams generated in high vacuum may be used. Compared to wet etching, dry etching allows for precision machining on a micro-structure without geometric constraints. A CF-based gas may be used for oxide film etching of the mask 33. For example, an etchant obtained by combining at least one of O7 and Ar with a gas such as $CF_4$, $C_2F_6$, $C_3F_8$, $C_4F_8$, or $CHF_3$ may be used.

Figure 11A:
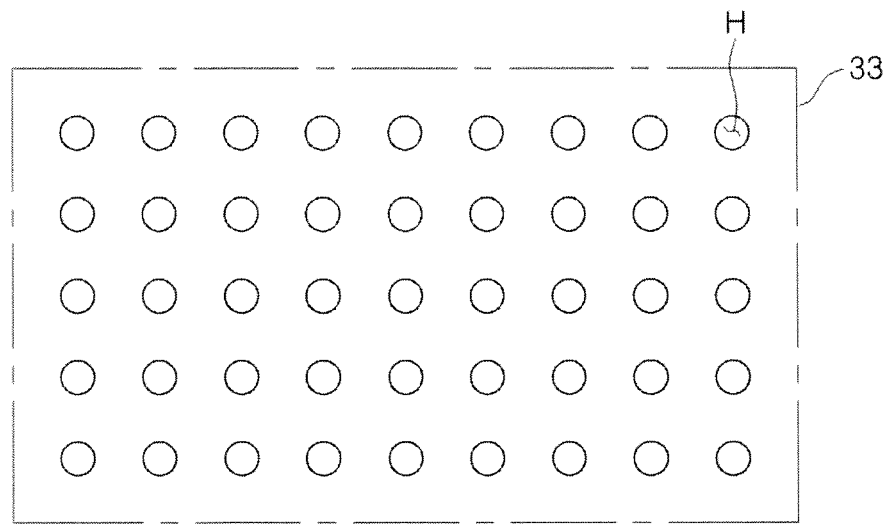
FIGS. 11A and 11B are top plan views illustrating examples of a mask with openings having various shapes.
Figure 11B:
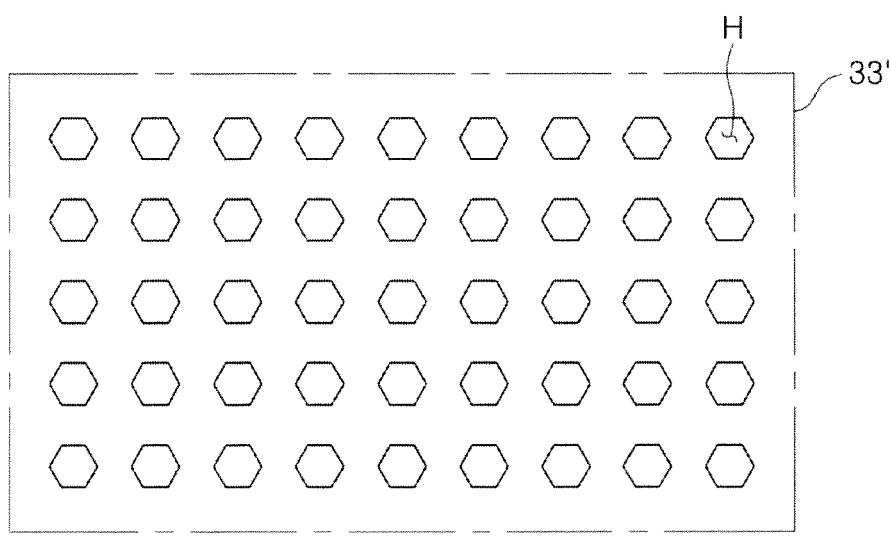

The shapes and arrangements of the openings H may be varied. For example, when viewed from above, the shapes of the openings H may be polygonal, quadrangular, oval, or circular. The mask 33 illustrated in FIG. 10B may have an array of openings H having a circular cross-section as illustrated in FIG. 11A, but the openings in the mask 33 may have any other shapes and arrangements as needed. For example, an array of openings having a regular hexagonal cross-section may be formed in a mask 33' as illustrated in FIG. 11B.

Figure 12A:
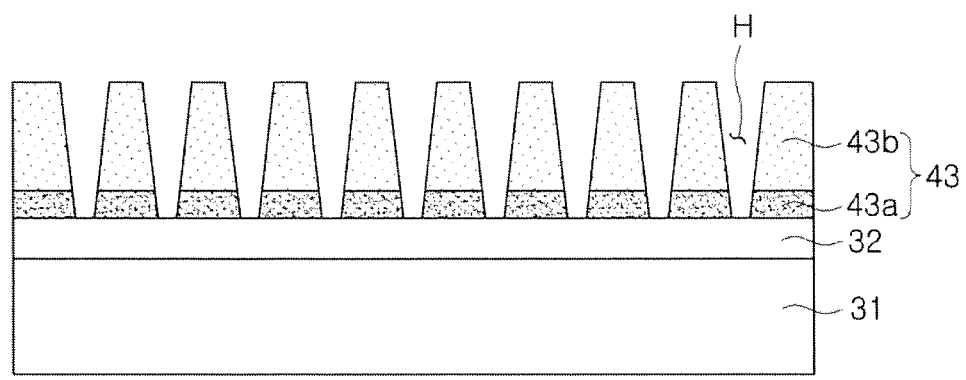
FIGS. 12A and 12B are cross-sectional front elevation views illustrating examples of a mask with openings having various shapes.
Figure 12B:
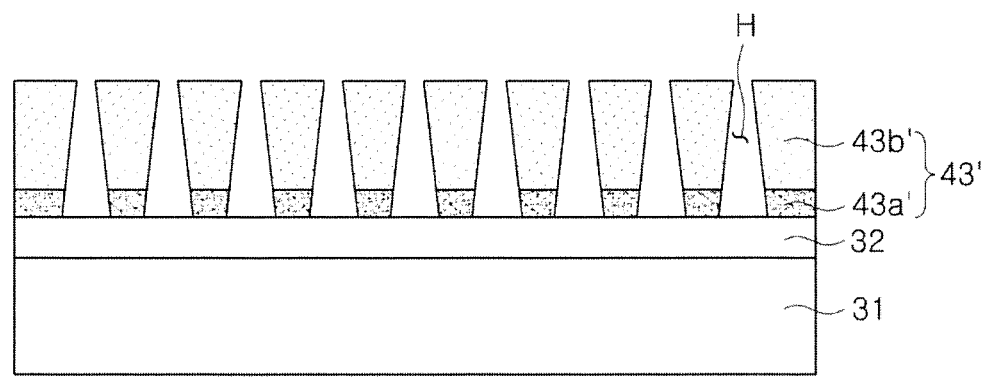

The openings H illustrated in FIG. 10B may have a rod structure having a uniform diameter (or width), but are not limited thereto. The openings H may have various other structures using an appropriate etching process. For example, masks having different shapes are illustrated in FIGS. 12A and 12B. In FIG. 12A, a mask 43 including first and second material layers 43a and 43b may have openings H having a rod structure of which a cross-sectional area is increased in a direction toward an upper portion thereof. In FIG. 12B, a mask 43' including first and second material layers 43a' and 43b' may have openings H having a rod structure of which a cross-sectional area is decreased in a direction toward an upper portion thereof.

Figure 10C:
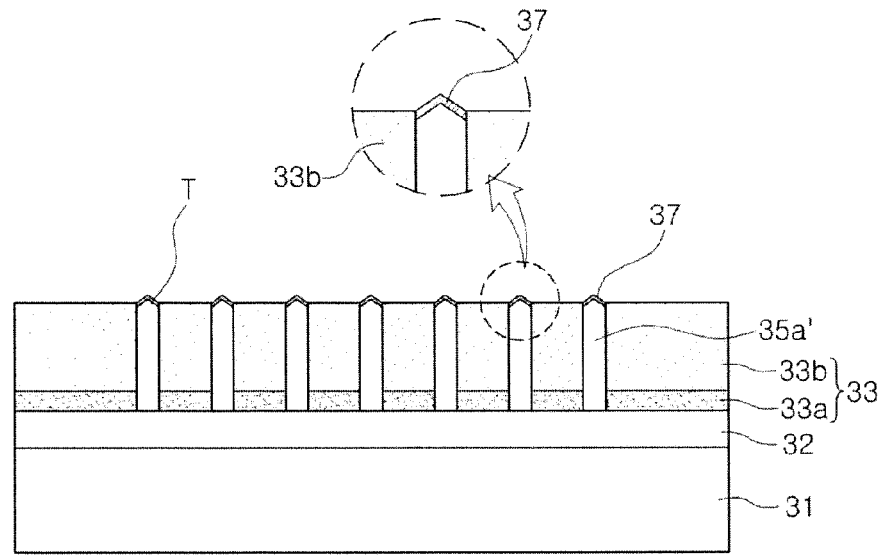

Thereafter, as illustrated in FIG. 10C, a first conductivity-type nitride semiconductor is grown on the exposed regions of the base layer 32 to fill the plurality of openings H, thus forming a plurality of nanocores 35a', and a current suppressing intermediate layer 37 may be subsequently formed on tip portions T of the nanocores 35a'.

The nanocores 35a' may be formed of an n-type nitride semiconductor which may be the same material as that of the base layer 32. For example, the base layer 32 and the nanocores 35a may be formed of n-type GaN.

A nitride single crystal forming the nanocore 35a' may be formed using metal-organic chemical vapor deposition (MOCVD) or molecular beam epitaxy (MBE), and in this case, the mask 33 may serve as a mold for growing nitride single crystals to provide the nanocores 35a' corresponding to the shape of the openings H. Namely, the nitride single crystal may be selectively grown on the regions of the base layer 32 exposed through the openings H of the mask 33, while filling the openings H, and thus, the shape of the grown nitride single crystal may correspond to that of the openings H.

With the mask 33 being retained, the current suppressing intermediate layer 37 may be formed on surfaces of tip portions T of the nanocores 35a'. Thus, the current suppressing intermediate layer 37 may be easily formed on the desired tip portions T, even without performing a process of forming an additional mask.

The current suppressing intermediate layer 37 may be a semiconductor layer which is not doped on purpose, or may be a semiconductor layer doped with a second conductivity-type impurity different from that of the nanocores 35a'. For example, in a case in which the nanocores 35a' are formed of n-type GaN, the current suppressing intermediate layer 37 may be formed of undoped GaN or GaN doped with a p-type impurity such as magnesium (Mg). In this case, the nanocores 35a' and the current suppressing intermediate layer 37 may be continuously formed by changing only the types of impurity during the same growth process. In this manner, the process of forming the current suppressing intermediate layer 37 and the mold process may be combined to further simplify the overall process.

Figure 10D:
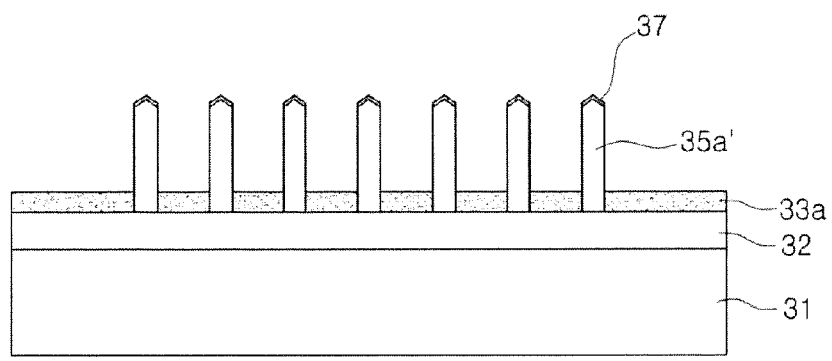

Subsequently, as illustrated In FIG. 10D, the mask 33 may be partially removed to the level of the first material layer 33a serving as an etch-stop layer to thereby expose portions of lateral surfaces of the plurality of nanocores 35a'.

In the present exemplary embodiment, by using an etching process of selectively removing the second material layer 33b, only the second material layer 33b may be removed, while the first material layer 33a may be retained. The residual first material layer 33a may serve to prevent the active layer 35b and the second conductivity-type semiconductor layer 35c from being connected to the base layer 32 in a follow-up growth process.

In the present exemplary embodiment, an additional heat treatment process may be introduced during the process of manufacturing the light emitting nanostructures using the mask having openings as a mold in order to enhance crystallinity.

Before the forming of the current suppressing intermediate layer 37, a stabilizing process (a heat treatment process) or a regrowth process may be performed while the nanocores 35a' are being grown to enhance crystal quality of the nanocores 35a'. For example, when the nanocores 35a' are grown to reach a desired growth intermediate point (a height ranging from approximately 0.2 μm to 1.8 μm from the base layer), supply of a TMGa source, a Group-III element source of GaN, may be stopped and a heat treatment may be performed at a temperature (ranging from approximately 1000° C. to 1200° C.) similar to that of the substrate during the growth of the nanocores for approximately five seconds to five minutes under an $NH_3$ atmosphere.

Figure 10E:
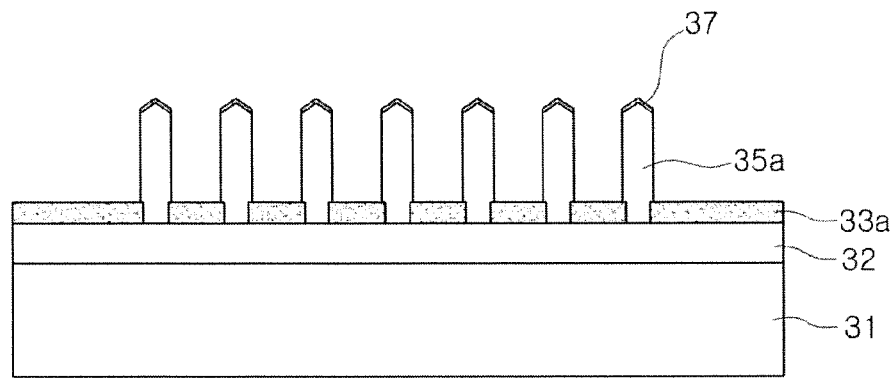

Also, after the nanocores 35a' are completely grown and the second material layer 33b of the mask 33 is removed, as illustrated in FIG. 10E, the surfaces of the nanocores 35a may be heat-treated under predetermined conditions to change a crystal plane of each nanocore 35a' into a stable crystal plane advantageous for crystal growth. This process will be described with reference to FIGS. 13A and 13B.

Figure 13A:
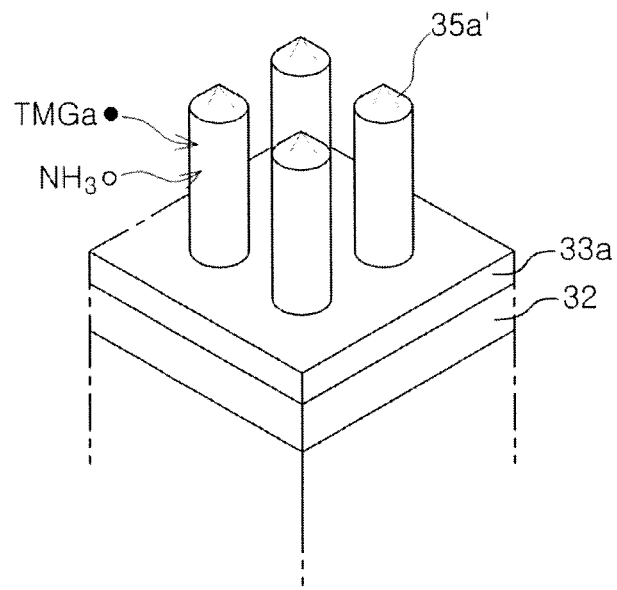
FIGS. 13A and 13B are perspective views illustrating a heat treatment process or a regrowth process applied to FIGS. 10D and 10E.
Figure 13B:
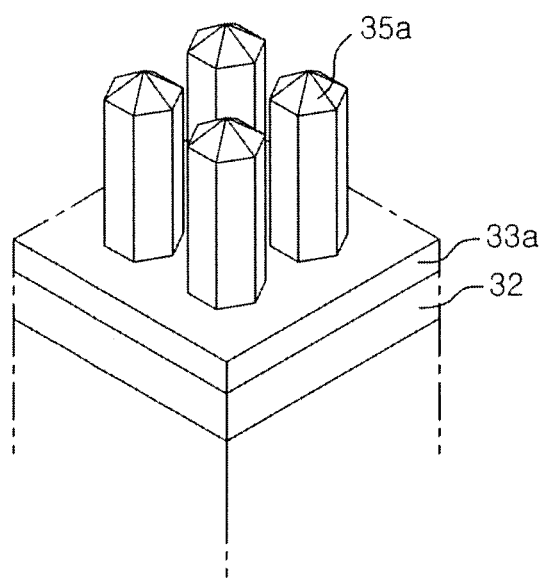

FIGS. 13A and 13B are schematic views illustrating a heat treatment process or a regrowth process applied to FIGS. 10D and 10E.

FIG. 13A illustrates the nanocores 35a' obtained in FIG. 10D. The nanocores 35a' may have crystal planes determined depending on the shape of the openings H. Although differing depending on the shape of openings H, in general, the surfaces of the nanocores 35a' obtained thusly may have relatively unstable crystal planes, which may not be advantageous for a follow-up crystal growth.

In the present exemplary embodiment, when the openings have a cylindrical rod shape, the lateral surface of the nanocore 35a' may be curved, rather than having a particular crystal plane.

When such nanocores 35a' are heat-treated or regrown, unstable crystals on the surfaces thereof may be rearranged to have stable crystal planes such as non-polar or semi-polar planes.

As for the heat treatment conditions, the nanocores 35a' may be heat-treated at a temperature equal to or higher than 600° C., and in a specific example, at a temperature ranging from 800° C. to 1200° C., for a few seconds to tens of minutes (1 second to 60 minutes). In the heat treatment process, if the substrate temperature is lower than 600° C., it may be difficult to grow and rearrange crystals of the nanocores, causing difficulty in obtaining a heat treatment effect, and if the substrate temperature is lower than 1200° C., nitrogen (N) may be evaporated from the GaN crystal planes to degrade crystal quality. Also, it is difficult to obtain a sufficient heat treatment effect for a period of time shorter than 1 second, and a heat treatment performed for tens of minutes, for example, for a period of time longer than 60 minutes, may degrade manufacturing process efficiency.

A regrowth process may be performed during a predetermined period of time under conditions similar to the growth conditions of the nanocores 35a'. For example, after n-type GaN nanocores are grown, a mask may be removed, and a MOCVD process may be resumed to grow n-type GaN, thereby stabilizing surfaces of the nanocores 35a.

As illustrated in FIG. 13A, when the nanocores 35a' are grown on a C(0001) plane of a sapphire substrate ((111) plane in case of a silicon substrate), the nanocores 35a' having a cylindrical shape may be heat-treated at an appropriate temperature range as mentioned above or may be subjected to a regrowth process to change the curved surface (the lateral surface), an unstable crystal plane, into a hexagonal crystal system (35a in FIG. 13B) having a non-polar surface (an m-plane) as a stable crystal plane. Stabilization of the crystal plane may be realized through the heat treatment process performed at a high temperature or the regrowth process. In the case of using the heat treatment process, when crystals positioned on the surfaces of the nanocores are rearranged at a high temperature or a source gas remains within a chamber, such a residual source gas is deposited to perform partial regrowth to have a stable crystal plane.

Also, in the case of using the regrowth process, as illustrated in FIG. 13A, like the growth process of the nanocores 35a', a source gas such as TMGa or $NH_3$ is supplied within a MOCVD chamber to allow the source gas to react with the surfaces of the nanocores 35a' to form stable crystal planes through the regrowth process. Due to this regrowth, widths of the heat-treated nanocores 35a may be slightly increased, relative to those of the nanocores 35a' prior to the heat treatment process (please refer to FIGS. 13A and 13B).

In this manner, the introduction of the additional heat treatment process or the regrowth process may contribute to enhancement of crystallinity of the nanocores. Namely, through the heat treatment process or the regrowth process, non-uniformity (for example, a defect, or the like) present on the surfaces of the nanocores after the removal of the mask may be removed and stability of the crystals may be significantly enhanced through rearrangement of the internal crystals. The regrowth process may be performed under conditions similar to those of the process of growing the nanocores within a chamber after the removal of the mask.

Figure 10F:
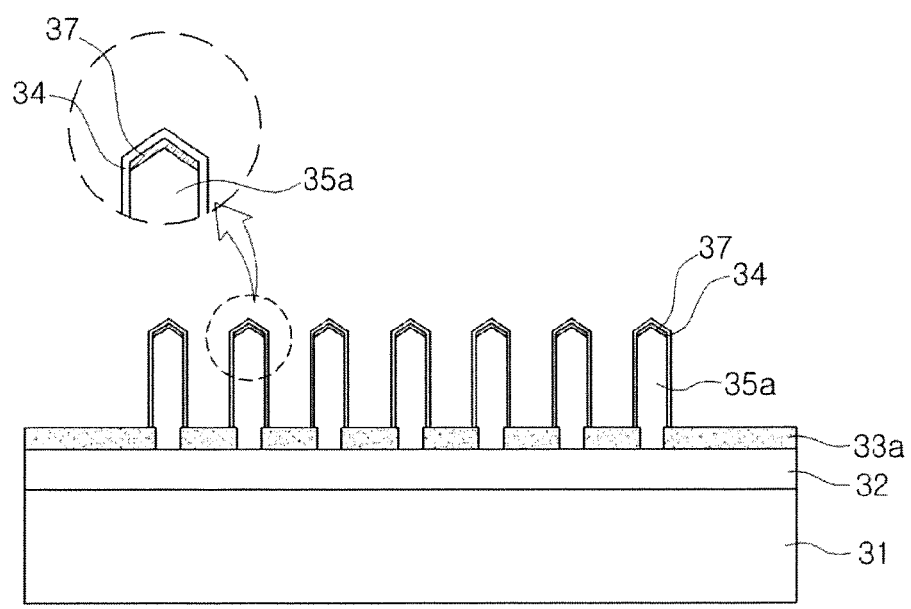

Subsequently, as illustrated in FIG. 10F, a stress control layer 34 may be formed on the surfaces of the plurality of nanocores 35a.

The stress control layer 34 may be obtained through a process of growing nitride layers containing indium (In). The stress control layer 34 may have various types of superlattice structure other than the superlattice structure as in the previous exemplary embodiment or may be an InGaN bulk layer. In such a different superlattice structure, a content of indium or a thickness of at least one of first and second layers may be different from that of the other layers. Examples of the superlattice structure illustrated in FIGS. 4B through 4D may be referred to.

Strain energy may be controlled by appropriately selecting the content of indium in the stress control layer 34 and the thickness of the stress control layer 34, whereby an active layer may be formed to emit light having a desired long wavelength. The stress control layer 34 may be doped with a first conductivity-type impurity (e.g., an n-type impurity). The impurity doping may distinguish the stress control layer 34 from the active layer contributing to the emission of light.

Figure 10G:
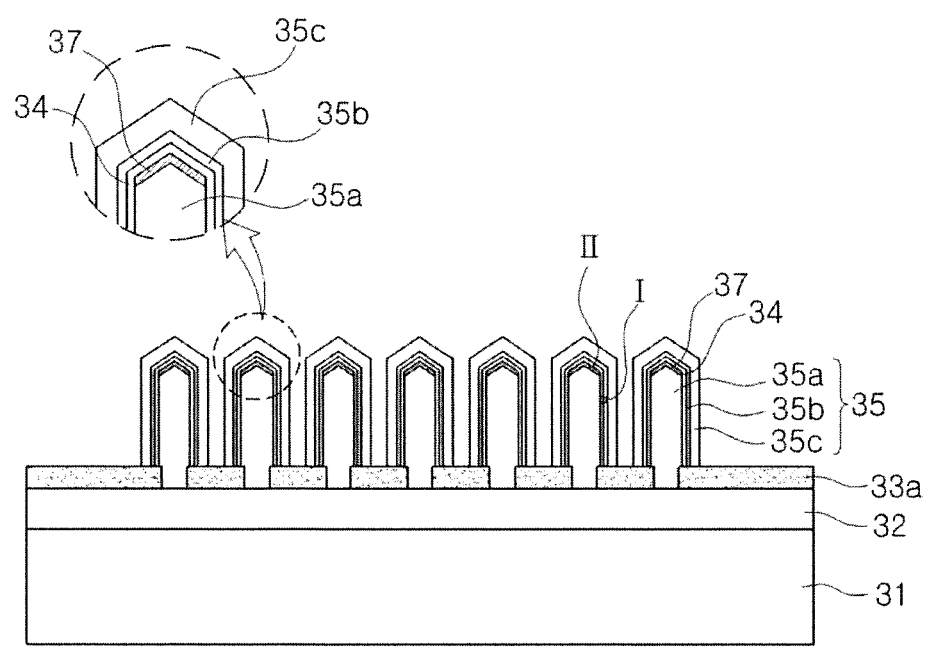

Subsequently, as illustrated in FIG. 10G, an active layer 35b and a second conductivity-type nitride semiconductor layer 35c may be sequentially grown on the surface of the stress control layer 34.

Through this process, each light emitting nanostructure 35 may have a core-shell structure including the nanocore 35a formed of the first conductivity-type nitride semiconductor and shell layers including the active layer 35b and the second conductivity-type nitride semiconductor layer 35c covering the nanocore 35a.

The nanocore 35a may have a tip portion having a crystal plane different from that of the lateral surface thereof, and as mentioned above, portions II of the active layer 35b and the second conductivity-type nitride semiconductor layer 35c formed on the tip portion and portions I of the active layer 35b and the second conductivity-type nitride semiconductor layer 35c may have different compositions and/or thicknesses. In order to address a leakage current and a wavelength difference in emitted light, the current suppressing intermediate layer 37 may be disposed on the tip portion of the nanocore 35a. Due to the selective disposition of the current suppressing intermediate layer 37, a current flow through the portion of the active layer formed on the tip portion of the nanocore 35a may be blocked by the current suppressing intermediate layer 37, while a current flow through the portion of the active layer formed on the lateral surface of the nanocore 35a may be normally guaranteed.

Accordingly, a leakage current concentrated on the tip portion of the nanocore 35a may be effectively suppressed, resulting in excellent luminous efficiency.

The mask employed in the exemplary embodiment as described above includes the two material layers, but is not limited thereto. The mask may also be provided to have three or more layers.

For example, in a case of using a mask having first to third material layers sequentially formed on the base layer, the second material layer, as an etch-stop layer, may be formed of a material different from those of the first and third material layers. The first and third material layers may be formed of the same material as needed.

At least the second material layer may have an etching rate lower than that of the third material layer, so the second material layer may act as an etch-stop layer and may be retained under etching conditions of the third material layer. At least the first material layer may be formed of a material having electrical insulating properties, and the second or third material layer may also be formed of an insulating material as needed.

FIGS. 14A through 14E are cross-sectional views illustrating a process of forming light emitting nanostructures using the mask 43 illustrated in FIG. 12A.

Figure 14A:
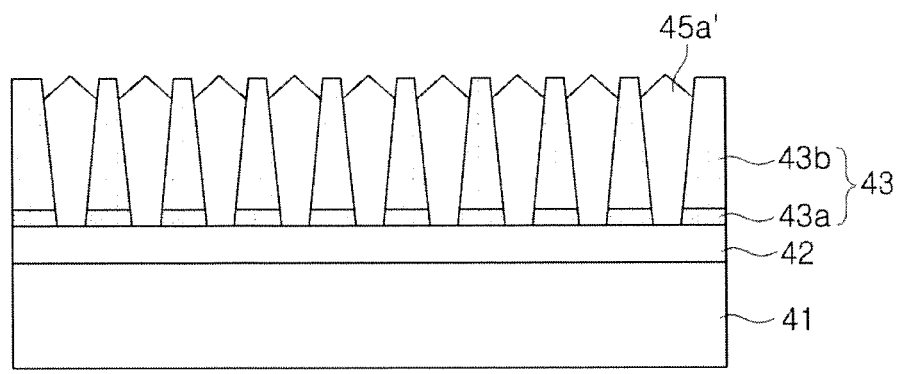
FIGS. 14A through 14E are cross-sectional front elevation views illustrating an example of a method for manufacturing a nanostructure semiconductor light emitting device according to an exemplary embodiment of the present disclosure.

As illustrated in FIG. 14A, nanocores 45a' may be grown on a base layer 42 using the mask 43. The base layer 42 may be formed on a substrate 41. The mask 43 has openings H, each of which has a width decreased toward a lower portion thereof. The nanocores 45a' may be grown to have a shape corresponding to that of the openings H.

In order to further enhance crystal quality of the nanocores 45a', a heat treatment process may be performed one or more times during the growth of the nanocores 45a'. In particular, a surface of a tip portion of each nanocore 45a' may be rearranged to have a hexagonal pyramidal crystal plane, thus obtaining a stable crystal structure and guaranteeing high quality of a crystal grown in a follow-up process.

The heat treatment process may be performed under the temperature condition as described above. For example, for the sake of process convenience, the heat treatment process may be performed at a temperature equal or similar to the growth temperature of the nanocores 45a'. Also, the heat treatment process may be performed in a manner of stopping a metal source such as TMGa, while maintaining a pressure and a temperature equal or similar to the growth pressure and temperature of the nanocores 45a'. The heat treatment process may be continued for a few seconds to tens of minutes (for example, 5 seconds to 30 minutes), but a sufficient effect may be obtained even with a time duration ranging from approximately 10 seconds to 60 seconds.

The heat treatment process introduced during the growth process of the nanocores 45a' may prevent degeneration of crystallinity caused when the nanocores 45a' are grown at a fast speed, and thus, fast crystal growth and excellent crystal quality may be promoted.

A period of time for a heat treatment process and the number of heat treatment processes for stabilization may be variously modified according to heights and diameters of final nanocores. For example, in a case in which a width of each opening ranges from 300 nm to 400 nm and a height of each opening (a thickness of the mask) is approximately 2.0 µm, a stabilization time duration ranging from approximately 10 seconds to 60 seconds may be inserted in a middle point, i.e., approximately 1.0 µm, to grow cores having desired high quality. The stabilization process may be omitted according to core growth conditions.

Figure 14B:
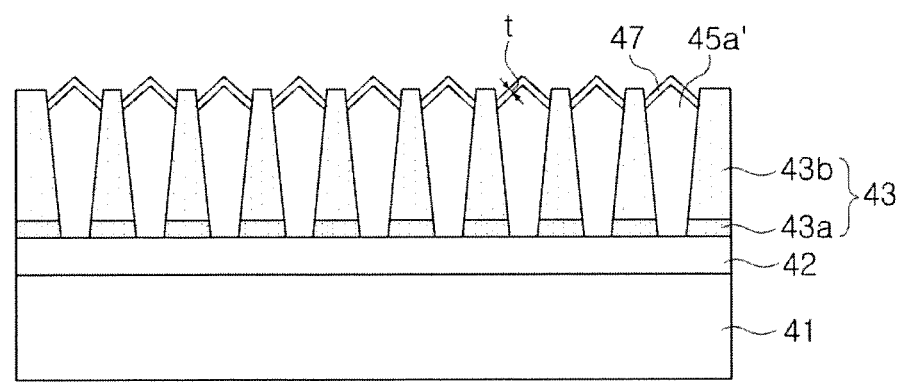

Subsequently, as illustrated in FIG. 14B, a current suppressing intermediate layer 47 may be formed on tip portions of the nanocores 45a'.

After the nanocores 45a' are formed to have a desired height, the current suppressing intermediate layer 47 may be formed on the surfaces of the tip portions of the nanocores 45a' with the mask 43 retained as is. Thus, since the mask 43 is used as is, the current suppressing intermediate layer 47 may be easily formed in the desired regions (the surfaces of the tip portions) of the nanocores 45a' without performing a process of forming an additional mask.

The current suppressing intermediate layer 47 may be a semiconductor layer which is not doped on purpose or may be a semiconductor layer which is doped with a second conductivity-type impurity different from that of the nanocores 45a'. For example, in a case in which the nanocores 45a' are n-type GaN, the current suppressing intermediate layer 47 may be undoped GaN or GaN doped with magnesium (Mg) as a p-type impurity. A thickness of the current suppressing intermediate layer 47 may be equal to or greater than approximately 50 nm, for the purpose of sufficient electrical resistance. A concentration of the second conductivity-type impurity (e.g., a p-type impurity: magnesium (Mg)) in the current suppressing intermediate layer 47 may be equal to or greater than approximately $1.0 \times 10^{16}/cm^3$. The thickness of the current suppressing intermediate layer 47 doped with the second conductivity-type impurity and the concentration of the second conductivity-type impurity may be appropriately traded-off. For example, when the current suppressing intermediate layer 47 is relatively thin, the doping concentration may be increased to secure resistivity, or vice versa.

In a specific example, in a case of stopping silicon (Si) doping, injecting magnesium (Mg), and grow the current suppressing intermediate layer 47 for approximately 1 minute under the same conditions as those of the growth of the n-type GaN nanocores, the thickness of the current suppressing intermediate layer 47 may range from approximately 200 nm to 300 nm, and such a current suppressing intermediate layer 47 may effectively block a leakage current of a few µA or more. In this manner, the current suppressing intermediate layer 47 may be simply formed during the mold-type process as in the present exemplary embodiment.

Figure 14C:
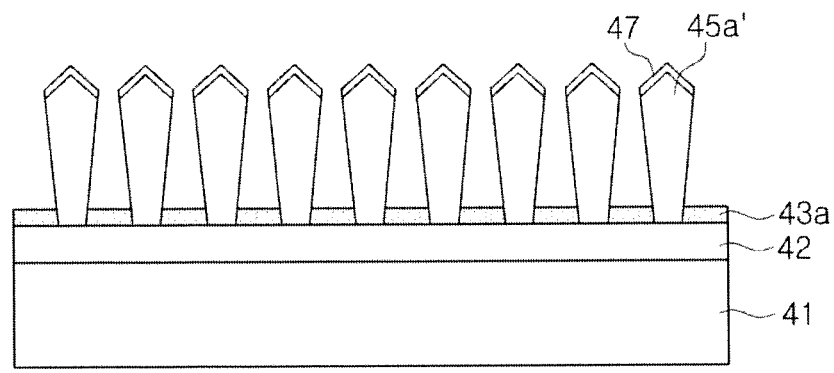

Subsequently, as illustrated in FIG. 14C, the mask 43 may be partially removed to the level of the first material layer 43a serving as an etch stop layer to thereby expose portions of the lateral surfaces of the plurality of nanocores 45a'.

In the present exemplary embodiment, by using the etching process of selectively removing the second material layer 43b, only the second material layer 43b may be removed, while the first material layer 43a may be retained. In the present exemplary embodiment, an additional heat treatment process may be introduced during the process of forming the light emitting nanostructures using the mask having openings as a mold in order to enhance crystallinity.

Figure 14D:
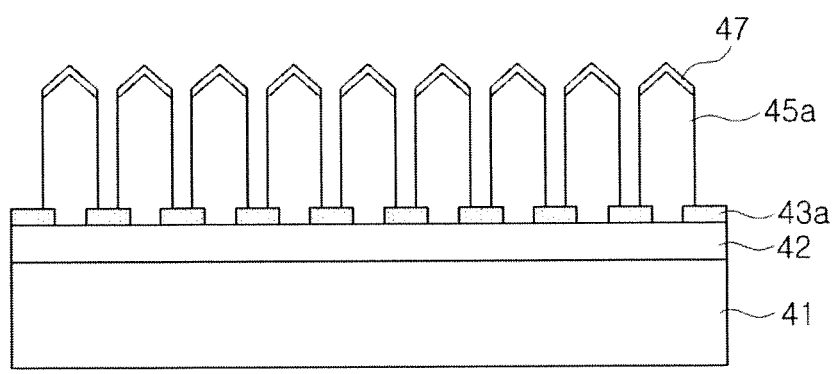

After the second material layer 43b of the mask 43 is removed, the nanocores 45a' may be regrown to change unstable crystal planes of the nanocores 45a' into stable crystal planes. The regrowth process may be performed under conditions the same as or similar to those of the growth process of the nanocores 45a' until the crystal planes thereof are stabilized. In particular, in the present exemplary embodiment, the nanocores 45a' are grown on the openings having sloped side walls to thus have the sloped side walls corresponding to the shape of the openings, but as illustrated in FIG. 14D, after the regrowth process is performed, crystals are rearranged and regrown so that the nanocores 45a may have a substantially uniform diameter (or width). Also, the tip portions of the nanocores 45a' immediately after being grown may have an incomplete hexagonal pyramidal shape, but the nanocores 45a after the regrowth process may have a hexagonal pyramidal shape having uniform surfaces. After the removal of the mask, the nanocores 45a' having a non-uniform width may be regrown (and rearranged) to have a hexagonal pyramidal structure having a uniform width while having stable crystal planes through the regrowth process.

Figure 14E:
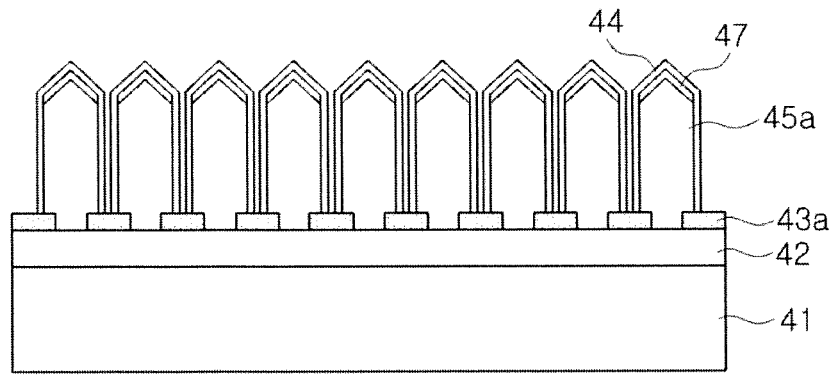

Subsequently, as illustrated in FIG. 14E, a stress control layer 44 may be formed on the surfaces of the plurality of nanocores 45a.

The stress control layer 44 may be obtained through a process of growing nitride layers containing indium (In). In the present exemplary embodiment, the stress control layer 44 may be disposed on the current suppressing intermediate layer. In this case, the stress control layer 44 may be doped with a first conductivity-type impurity (e.g., an n-type impurity). Alternatively, the stress control layer 44 may be doped to have a low concentration or undoped so as not to be provided as a current path that detours the current suppressing intermediate layer 47. The stress control layer 44 may be formed as an InGaN bulk layer or may have various types of superlattice structures illustrated in the previous exemplary embodiment.

The product illustrated in FIG. 14E may be subjected to the processes illustrated in FIGS. 8C through 8E and a follow-up electrode formation process so as to be manufactured as a nanostructure semiconductor light emitting device.

In the nanostructure semiconductor light emitting device illustrated in FIG. 10G, electrodes having various structures may be formed. FIGS. 15A through 15E are cross-sectional views illustrating an example of an electrode formation process.

Figure 15A:
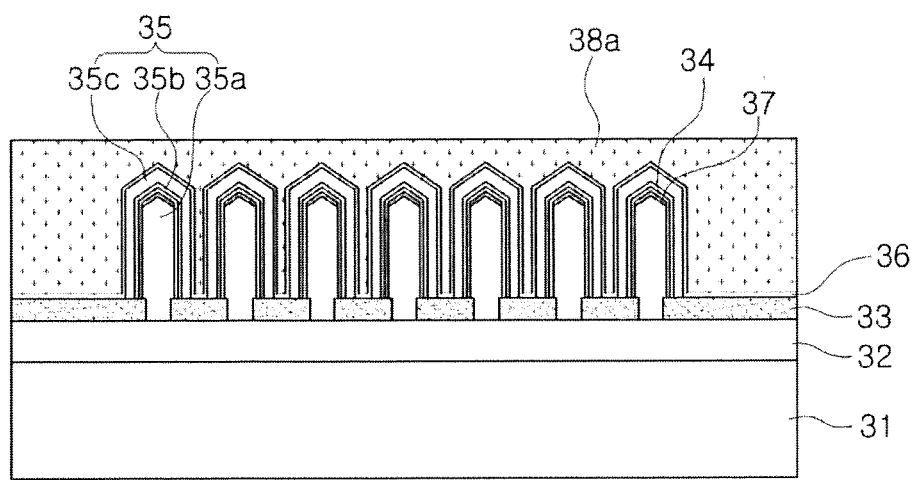
FIGS. 15A through 15E are cross-sectional front elevation views illustrating an example of an electrode formation process with respect to the resultant product illustrated in FIG. 10G.

As illustrated in FIG. 15A, a contact electrode 36 may be formed on the light emitting nanostructures 35, and a first passivation layer 38a may be subsequently formed. Such a first passivation layer 38a may be formed of at least one of the aforementioned materials of the insulating protective layer 8 in the previous exemplary embodiment.

Figure 15B:
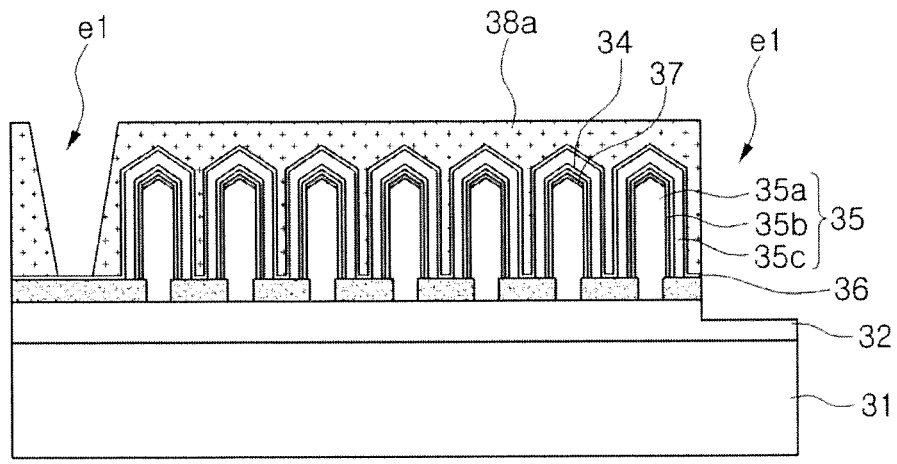

Subsequently, as illustrated in FIG. 15B, the first passivation layer 38a may be selectively removed to expose partial regions of the base layer 32 and the contact electrode 36 to provide electrode formation regions e1. In addition, the exposed regions e1 may be provided as regions in which a first electrode is to be formed. This process may be performed using a photolithography process.

Figure 15C:
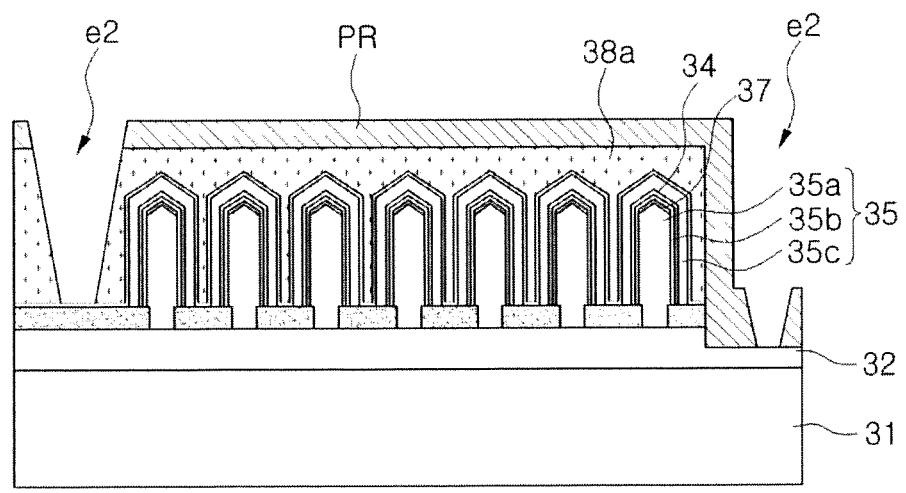
Figure 15D:
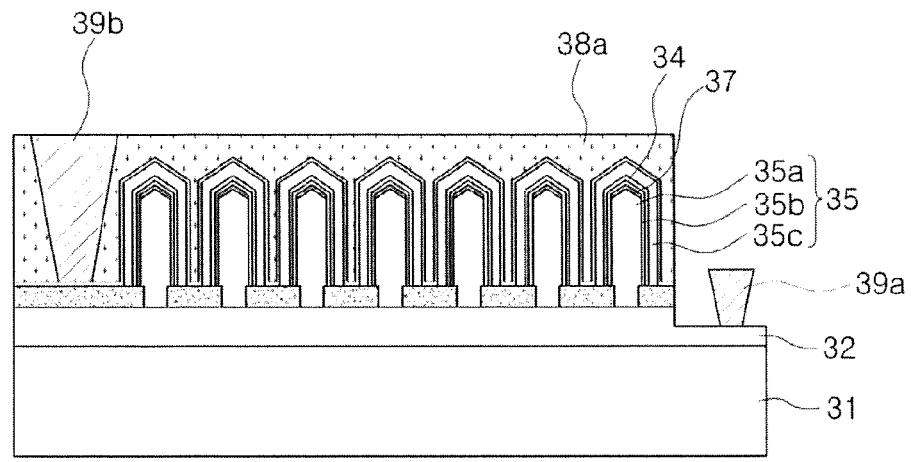

Thereafter, as illustrated in FIG. 15C, a photoresist PR may be formed to define contact regions e2 for first and second electrodes. Subsequently, as illustrated in FIG. 15D, first and second electrodes 39a and 39b may be formed in the contact regions e2. As an electrode material used in this process, a common electrode material of the first and second electrodes 39a and 39b may be used. For example, a material for the first and second electrodes 39a and 39b may be Au, Ag, Al, Ti, W, Cu, Sn, Ni, Pt, Cr, NiSn, TiW, AuSn, or a eutectic metal thereof.

Figure 15E:
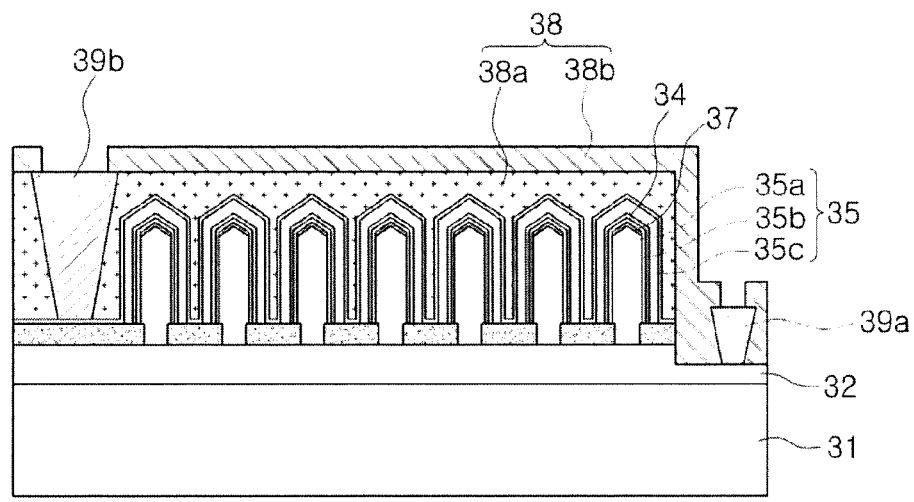

Subsequently, as illustrated in FIG. 15E, an additional second passivation layer 38b may be formed as needed. The second passivation layer 38b together with the first passivation layer 38a may provide a protective layer 38. The second passivation layer 38b may cover the exposed semiconductor region to protect the same and firmly support the first and second electrodes 39a and 39b.

The second passivation layer 38b may be formed of a material the same as or similar to that of the first passivation layer 38a.

FIGS. 16A through 16D are cross-sectional views illustrating an example of an electrode formation process with respect to the resultant product illustrated in FIG. 10G.

Figure 16A:
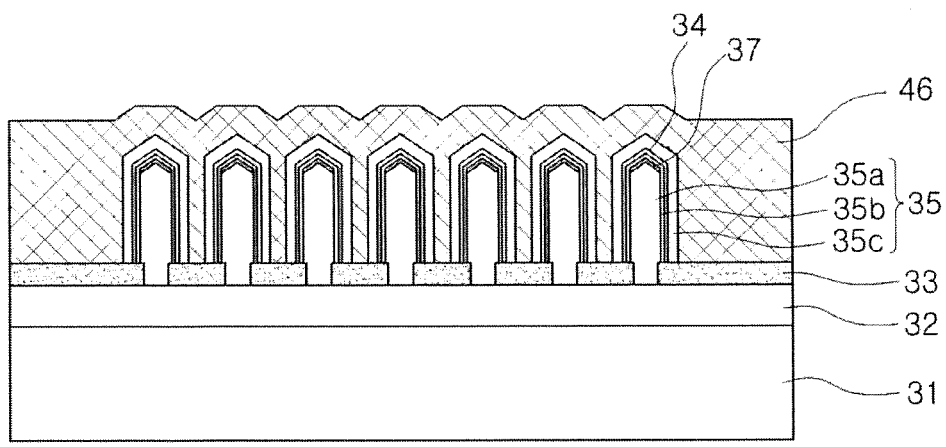
FIGS. 16A through 16D are cross-sectional front elevation views illustrating another example of an electrode formation process with respect to the resultant product illustrated in FIG. 10G.

First, as illustrated in FIG. 16A, a contact electrode 46 may be formed on the light emitting nanostructure 35 obtained in FIG. 10G. The contact electrode 46 may be formed to fill spaces between the light emitting nanostructures 35. The contact electrode 46 may be formed of a reflective material available for ohmic-contact. For example, the contact electrode 46 may include Ag, Ni, Al, Rh, Pd, Ir, Ru, Mg, Zn, Pt, Au, and the like, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, or Ni/Ag/Pt. In a specific example, the contact electrode 46 may be formed to fill the spaces between the light emitting nanostructures 35 by applying an electroplating process to the ohmic-contact material as a seed layer. For example, after Ag/Ni/Cr are formed as seed layers, Cu/Ni may be electroplated to form the desired contact electrode 46.

Figure 16B:
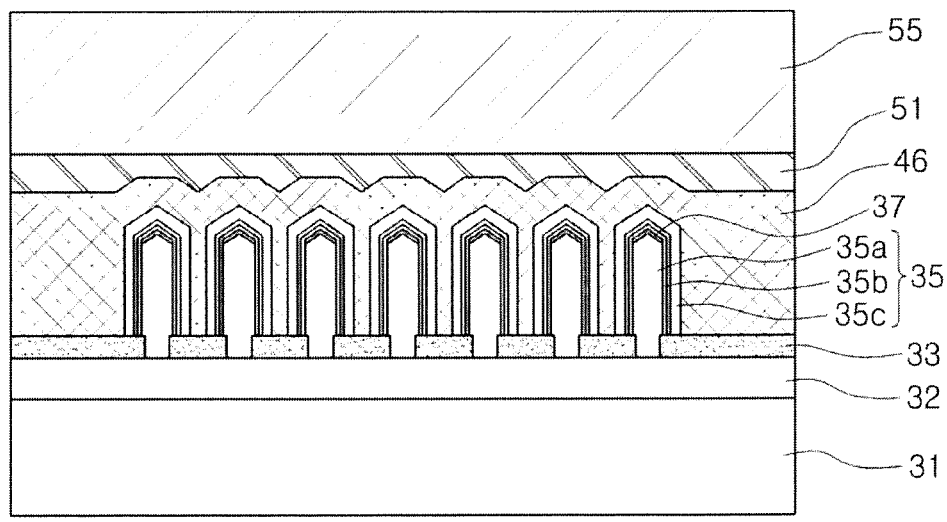

Subsequently, as illustrated in FIG. 16B, a permanent substrate 55 may be bonded to the contact electrode 46.

The permanent substrate 55 may be a conductive substrate. For example, the permanent substrate 55 may be a silicon (Si) substrate or an Si—Al alloy substrate. The permanent substrate 55 may be bonded to the contact electrode 46 using a bonding metal layer 51. The bonding metal layer 51 may be formed of a metal selected from the group consisting of Ni, Pt, Au, Cu, Co, Sn, In, Zn, Bi, Au, and combinations thereof, or alloys thereof. For example, the bonding metal layer 51 may be a eutectic metal layer such as Ni/Sn.

Figure 16C:
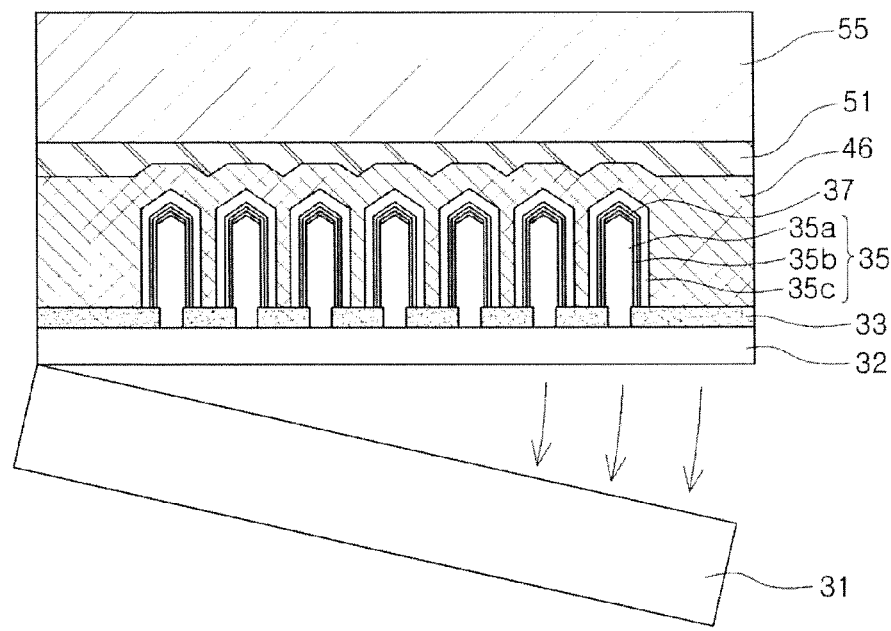

Thereafter, as illustrated in FIG. 16C, the substrate 31 used to grow crystals may be removed from the base layer 32 formed of a first conductivity-type nitride semiconductor.

This process may be performed using a laser lift-off (LLO) process. For example, the growth substrate 31 may be separated from the base layer 32 by irradiating a laser beam to an interface between the substrate 31 and the base layer 32.

Figure 16D:
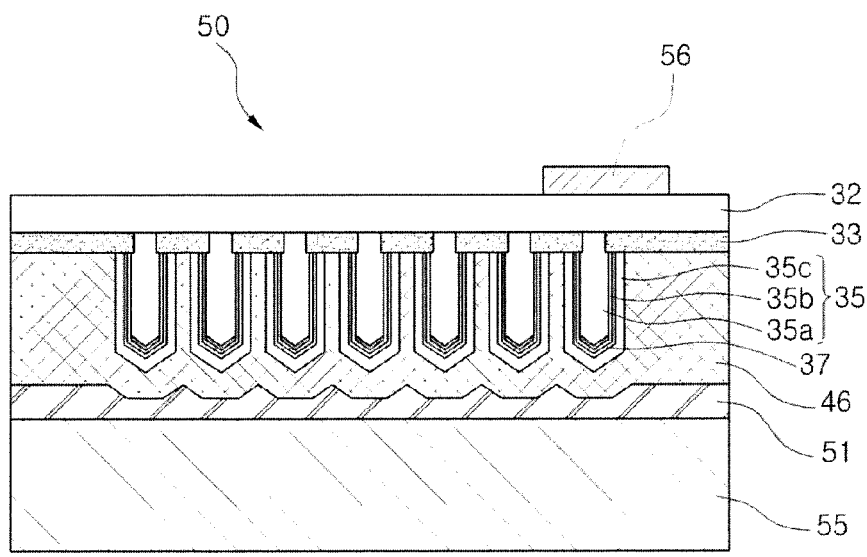

Subsequently, as illustrated in FIG. 16D, an electrode pad 56 may be formed on a surface of the base layer 32 from which the growth substrate 31 has been removed, to obtain a desired nanostructure semiconductor light emitting device 50. The permanent substrate 55, a conductive substrate, may be used as an electrode connected to an external circuit.

Figure 17:
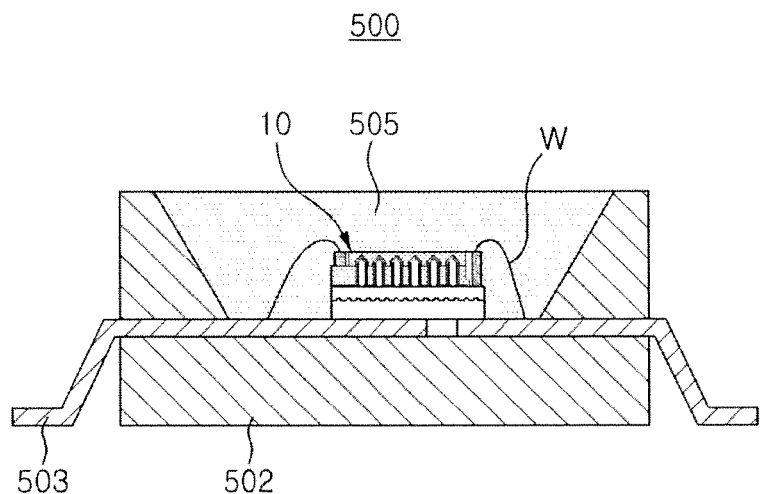
FIG. 17 is a cross-sectional front elevation view illustrating a package including the nanostructure semiconductor light emitting device illustrated in FIG. 1.
Figure 18:
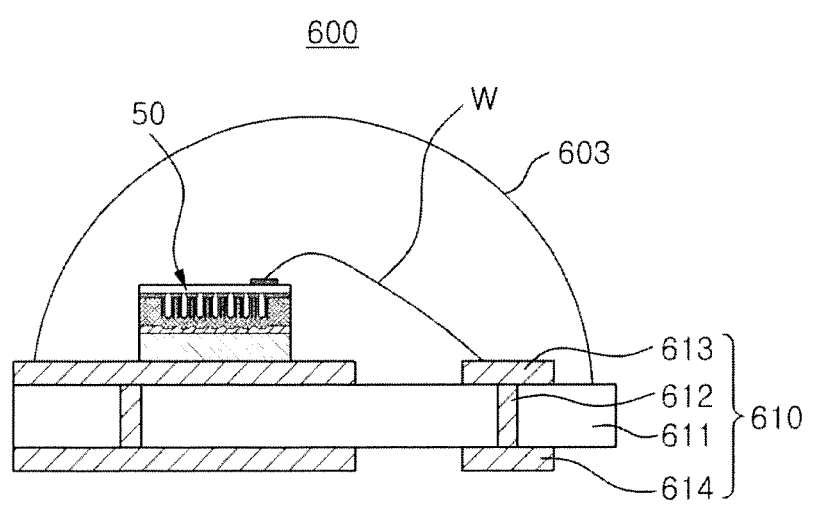
FIG. 18 is a cross-sectional front elevation view illustrating a package including the nanostructure semiconductor light emitting device illustrated in FIG. 16D.

The nanostructure semiconductor light emitting devices according to the foregoing exemplary embodiments may be provided in various types of products. FIGS. 17 and 18 illustrate examples of a package including the foregoing nanostructure semiconductor light emitting device.

A semiconductor light emitting device package 500 illustrated in FIG. 17 may include the nanostructure semiconductor light emitting device 10 illustrated in FIG. 1, a package body 502, and a pair of lead frames 503.

The nanostructure semiconductor light emitting device 10 may be mounted on the lead frames 503 and electrically connected to the lead frames 503 through wires W. If necessary, the nanostructure semiconductor light emitting device 10 may be mounted on a different region, for example, on the package body 502, rather than on the lead frames 503. The package body 502 may have a cup shape to improve reflectivity efficiency of light. An encapsulant 505 formed of a light-transmissive material may be formed in the reflective cup to encapsulate the semiconductor light emitting device 10, the wires W, and the like.

A semiconductor light emitting device package 600 may include the nanostructure semiconductor light emitting device 50 illustrated in FIG. 16D, a mounting board 610, and an encapsulant 603.

The nanostructure semiconductor light emitting device 50 may be mounted on the mounting board 610 and electrically connected to the mounting board 610 through a wire W.

The mounting board 610 may include a board body 611, an upper electrode 613, a lower electrode 614, and a through electrode 612 connecting the upper electrode 613 and the lower electrode 614. Also, the mounting board 610 may be provided as a board such as a printed circuit board (PCB), a metal core printed circuit board (MCPCB), a metal printed circuit board (MPCB), or a flexible printed circuit board (FPCB), and the structure of the mounting board 610 may be modified to have various forms.

The encapsulant 603 may be formed to have a lens structure of which an upper surface has a convex dome shape. However, according to exemplary embodiments, the encapsulant 603 may have a lens structure having a convex or concave surface to adjust an angle of light emitted through the upper surface of the encapsulant 603. If necessary, a wavelength conversion material such as a phosphor and a quantum dot may be disposed in the surface of the encapsulant 603 or the nanostructure semiconductor light emitting device 50.

The nanostructure semiconductor light emitting device according to the foregoing exemplary embodiment may be employed as a light source of various products. FIGS. 19 through 22 illustrate various products including the foregoing nanostructure semiconductor light emitting device.

Figure 19:
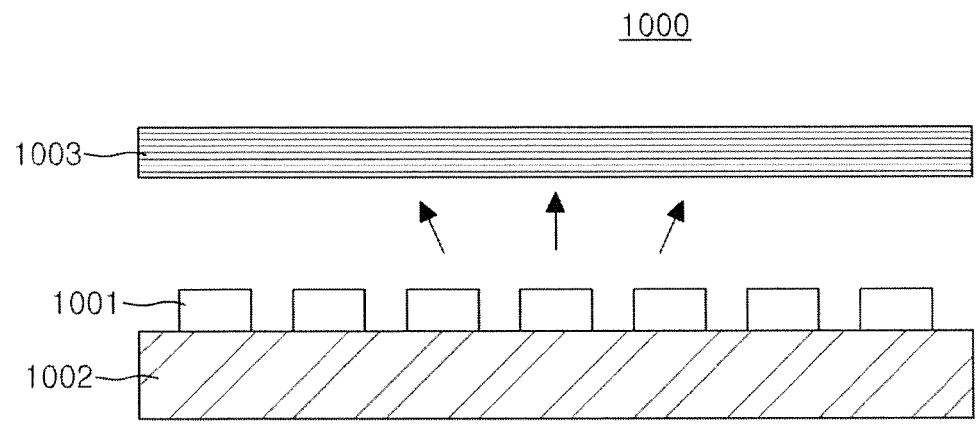
FIGS. 19 and 20 are cross-sectional front elevation views illustrating examples of a backlight unit including a nanostructure semiconductor light emitting device according to an exemplary embodiment of the present disclosure.

Referring to FIG. 19, a backlight unit 1000 includes at least one light source 1001 mounted on a substrate 1002 and at least one optical sheet 1003 disposed above the light source 1001. The nanostructure semiconductor light emitting device described above or the package having the nanostructure semiconductor light emitting device may be used as the light source 1001.

Figure 20:
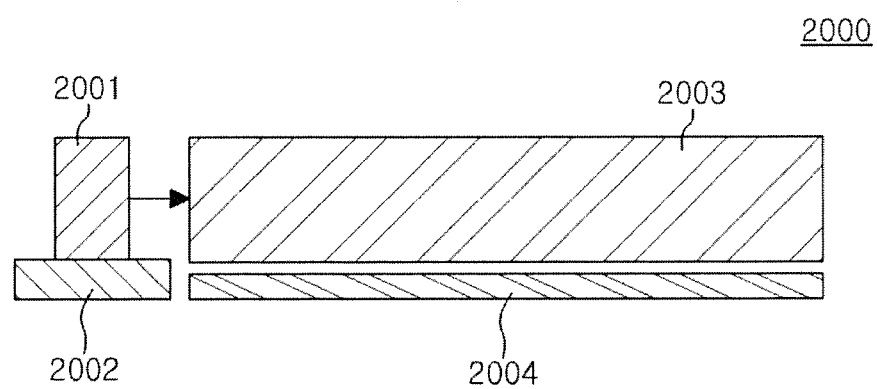

Unlike the backlight unit 1000 illustrated in FIG. 19 in which the light source 1001 may emit light toward a liquid crystal display (LCD) disposed thereabove, a backlight unit 2000 as another example illustrated in FIG. 20 may be configured such that a light source 2001 mounted on a substrate 2002 may emit light in a lateral direction, and the emitted light may be incident to a light guide plate 2003, whereby the backlight unit 2000 may serve as a surface light source. The light travelling to the light guide plate 2003 may be emitted upwards, and in order to enhance light extraction efficiency, a reflective layer 2004 may be disposed below the light guide plate 2003.

Figure 21:
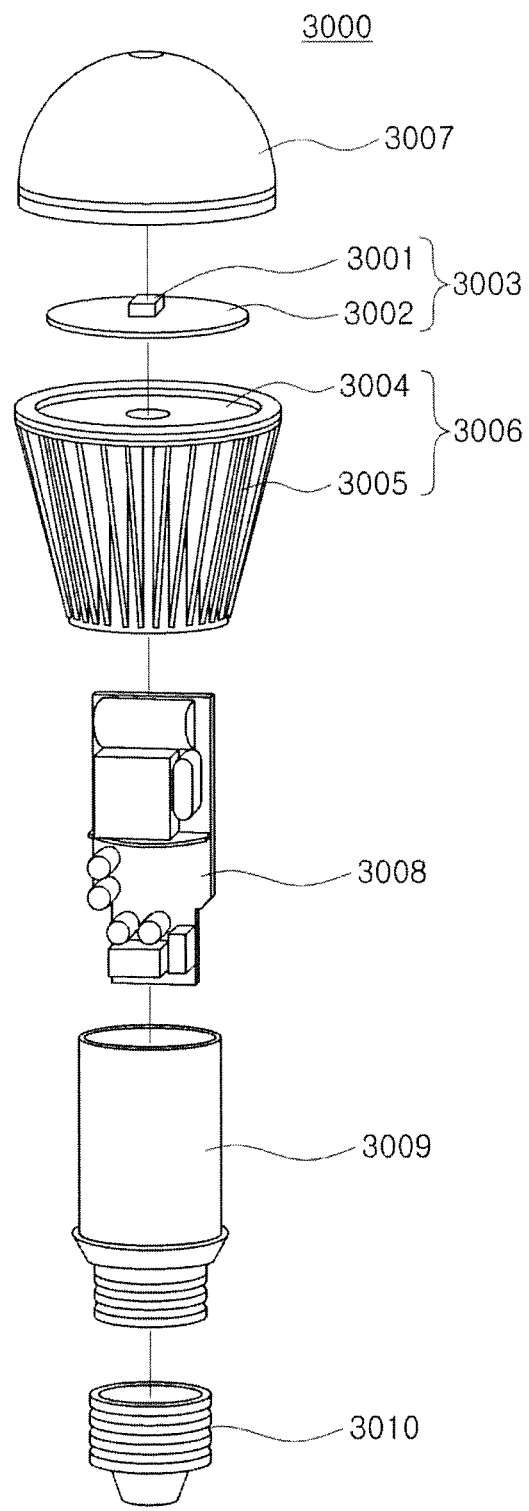
FIG. 21 is an exploded perspective view illustrating an example of a lighting device including a nanostructure semiconductor light emitting device according to an exemplary embodiment of the present disclosure.

FIG. 21 is an exploded perspective view illustrating an example of a lighting device including a nanostructure semiconductor light emitting device according to an exemplary embodiment of the present disclosure.

In FIG. 21, a lighting device 3000 is illustrated as a bulb-type lamp, and may include a light emitting module 3003, a driving unit 3008, and an external connection unit 3010.

The lighting device 3000 may further include external structures such as external and internal housings 3006 and 3009 and a cover unit 3007. The light emitting module 3003 may include a light source 3001 that may be the nanostructure semiconductor light emitting device or the package having the nanostructure semiconductor light emitting device described above, and a circuit board 3002 on which the light source 3001 is mounted. For example, first and second electrodes of the nanostructure semiconductor light emitting device may be electrically connected to an electrode pattern of the circuit board 3002. In the present exemplary embodiment, it is illustrated that a single light source 3001 is mounted on the circuit board 3002, but a plurality of light sources may be mounted as needed.

The external housing 3006 may serve as a heat dissipation unit and may include a heat dissipation plate 3004 disposed to be in direct contact with the light emitting module 3003 to enhance heat dissipation and heat dissipation fins 3005 surrounding the lateral surfaces of the lighting device 3000. The cover unit 3007 may be installed on the light emitting module 3003 and have a convex lens shape. The driving unit 3008 may be installed in the internal housing 3009 and connected to the external connection unit 3010 having a socket structure to receive power from an external power source.

Also, the driving unit 3008 may serve to convert the received power into power appropriate for driving the light source 3001 of the light emitting module 3003, and provide the converted power thereto. For example, the driving unit 3008 may be provided as an AC-DC converter, a rectifying circuit, or the like.

Figure 22:
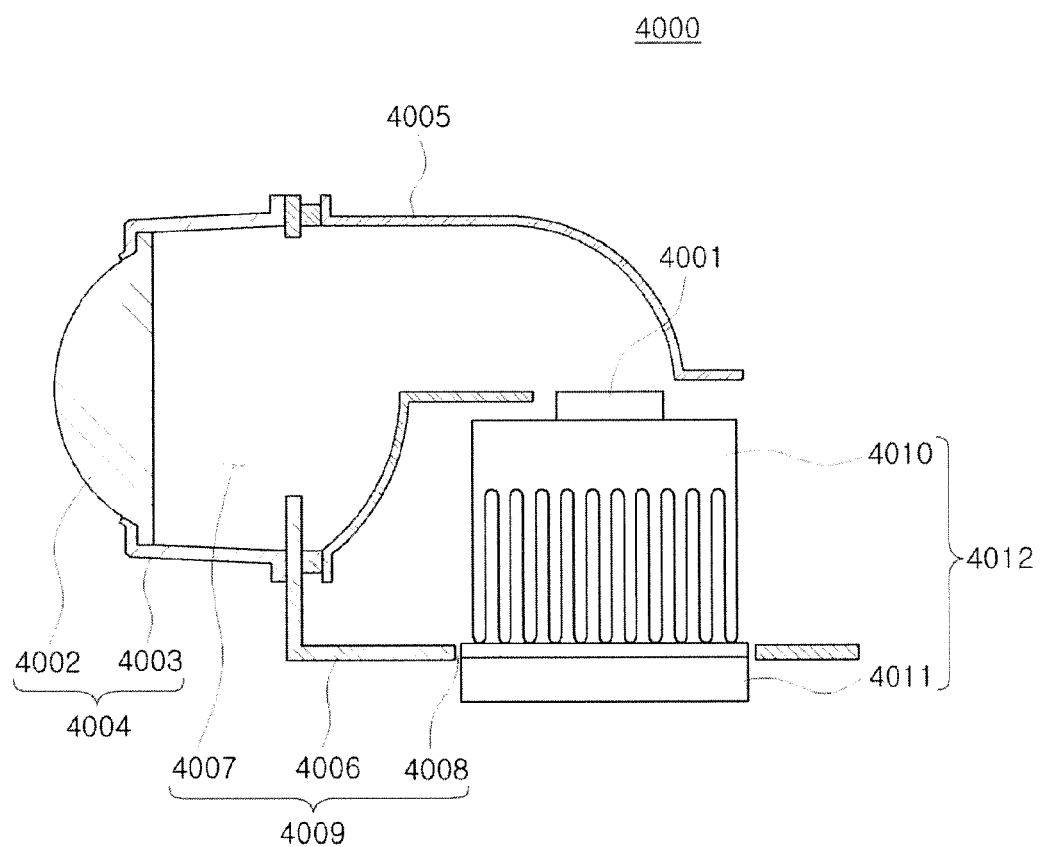
FIG. 22 is a cross-sectional front elevation view illustrating an example of a headlamp including a nanostructure semiconductor light emitting device according to an exemplary embodiment of the present disclosure.

FIG. 22 is a view illustrating an example of a headlamp including a nanostructure semiconductor light emitting device according to an exemplary embodiment of the present disclosure.

Referring to FIG. 22, a headlamp 4000 used as a vehicle lamp, or the like, may include a light source 4001, a reflective unit 4005, and a lens cover unit 4004. The lens cover unit 4004 may include a hollow guide 4003 and a lens 4002. The light source 4001 may include the nanostructure semiconductor light emitting device or the package including the nanostructure semiconductor light emitting device described above.

The headlamp 4000 may further include a heat dissipation unit 4012 outwardly dissipating heat generated by the light source 4001. In order to effectively dissipate heat, the heat dissipation unit 4012 may include a heat sink 4010 and a cooling fan 4011. Also, the headlamp 4000 may further include a housing 4009 fixedly supporting the heat dissipation unit 4012 and the reflective unit 4005, and the housing 4009 may include a body 4006 and a central hole 4008 formed in one surface thereof, to which the heat dissipation unit 4012 is coupled.

The housing 4009 may have a front hole 4007 formed in the other surface thereof integrally connected to one surface thereof and bent in a right angle direction. The reflective unit 4005 may be fixed to the other surface of the housing 4009 so as to be positioned above the light source 4001. Accordingly, light generated in the light source 4001 may be reflected by the reflective unit 4005 and pass through the front hole 4007 so as to be output outwardly.

As set forth above, according to exemplary embodiments of the present disclosure, the stress control layer containing indium is introduced between the active layer containing indium and the nanocores, alleviating stress due to a difference in lattice constants, whereby surface roughness of the active layer may be improved and a crystal defect can be suppressed. Accordingly, the incorporation of indium in the active layer may be increased, and as a result, the active layer emitting light having a relatively long wavelength under the same conditions may be provided.

While exemplary embodiments have been shown and described above, it will be apparent to those skilled in the art that modifications and variations could be made without departing from the scope of the invention as defined by the appended claims.

What is claimed is:

1. A nanostructure semiconductor light emitting device comprising:
   a base layer formed of a first conductivity-type nitride semiconductor; and
   a plurality of light emitting nanostructures disposed spaced apart from one another on the base layer,
   wherein each of the plurality of light emitting nanostructures comprises:
      a nanocore formed of the first conductivity-type nitride semiconductor;
      a stress control layer disposed on a surface of the nanocore and including a nitride semiconductor containing indium;
      an active layer disposed on the stress control layer and including a nitride semiconductor containing indium; and
      a second conductivity-type nitride semiconductor layer disposed on the active layer.

2. The nanostructure semiconductor light emitting device of claim 1, wherein the stress control layer comprises n number of layers containing indium, and
   the stress control layer satisfies the equation $$\sum_{i=1}^{n} x_i^2 t_i > 0.12,$$

where a content of indium in an i-th layer and a thickness of the i-th layer, among the layers containing indium, are expressed by $x_i$ (mole ratio) and $t_i$ (nm), respectively, and n is a natural number equal to or greater than 1.

3. The nanostructure semiconductor light emitting device of claim 1, wherein the stress control layer comprises n number of layers containing indium, and
   each of the layers containing indium satisfies the equation $$x_i^2 t_i < 0.4,$$

where a content of indium in an i-th layer and a thickness of the i-th layer, among the layers containing indium, are expressed by $x_i$ (mole ratio) and $t_i$ (nm), respectively, and n is a natural number equal to or greater than 1.

4. The nanostructure semiconductor light emitting device of claim 1, wherein the stress control layer is an InGaN bulk layer.

5. The nanostructure semiconductor light emitting device of claim 1, wherein the stress control layer has a superlattice structure in which first layers formed of $In_{x1}Ga_{1-x1}N$ and second layers formed of $In_{x2}Ga_{1-x2}N$ are alternatively stacked, where $x_2 < x_1 < 1$ and $0 \le x_2 < x_1$.

6. The nanostructure semiconductor light emitting device of claim 5, wherein the second layers are formed of GaN.

7. The nanostructure semiconductor light emitting device of claim 5, wherein at least one of the first layers has a content of indium different from those of the other first layers.

8. The nanostructure semiconductor light emitting device of claim 5, wherein at least one of the first layers has a thickness different from those of the other first layers.

9. The nanostructure semiconductor light emitting device of claim 1, wherein the active layer emits light having a peak wavelength equal to or greater than 535 nm.

10. The nanostructure semiconductor light emitting device of claim 1, wherein the active layer has a structure in which quantum well layers formed of $In_{y1}Ga_{1-y1}N$ and quantum barrier layers formed of $In_{y2}Ga_{1-y2}N$ are alternatively stacked, where $y_2 < y_1 < 1$ and $0 \le y_2 < y_1$.

11. The nanostructure semiconductor light emitting device of claim 10, wherein the content $y_1$ of indium in each of the quantum well layers is equal to or greater than 0.2.

12. The nanostructure semiconductor light emitting device of claim 10, wherein the stress control layer has a superlattice structure in which first layers formed of $In_{x1}Ga_{1-x1}N$ and second layers formed of $In_{x2}Ga_{1-x2}N$ are alternately stacked, where $x_2 < x_1 < 1$ and $0 \le x_2 < x_1$.

13. The nanostructure semiconductor light emitting device of claim 12, wherein the first layer is thinner than the quantum well layer.

14. The nanostructure semiconductor light emitting device of claim 12, wherein the second layer is thinner than the quantum barrier layer.

15. The nanostructure semiconductor light emitting device of claim 12, wherein the content $x_1$ of indium in the first layer is lower than the content $y_1$ of indium in the quantum well layer.

16. The nanostructure semiconductor light emitting device of claim 1, wherein the stress control layer includes a nitride layer doped with a first conductivity-type impurity.

17. The nanostructure semiconductor light emitting device of claim 1, further comprising a current suppressing intermediate layer disposed between a surface of a tip portion of each nanocore and the stress control layer.

18. The nanostructure semiconductor light emitting device of claim 17, wherein the current suppressing intermediate layer is doped with a second conductivity-type impurity or is provided as an undoped nitride layer.

19. A light emitting device package comprising:
   a package board having first and second electrode structures; and
   a nanostructure semiconductor light emitting device mounted on the package board and electrically connected to the first and second electrode structures, the nanostructure semiconductor light emitting device comprising:
      a base layer formed of a first conductivity-type nitride semiconductor; and
      a plurality of light emitting nanostructures disposed spaced apart from one another on the base layer, each of the plurality of light emitting nanostructures comprising:
         a nanocore formed of the first conductivity-type nitride semiconductor;
         a stress control layer disposed on a surface of the nanocore and including a nitride semiconductor containing indium;
         an active layer disposed on the stress control layer and including a nitride semiconductor containing indium; and
         a second conductivity-type nitride semiconductor layer disposed on the active layer.

20. A lighting device comprising:
   a nanostructure semiconductor light emitting device comprising:
      a base layer formed of a first conductivity-type nitride semiconductor; and a plurality of light emitting nanostructures disposed spaced apart from one another on the base layer, each of the plurality of light emitting nanostructures comprising:
a nanocore formed of the first conductivity-type nitride semiconductor;
a stress control layer disposed on a surface of the nanocore and including a nitride semiconductor containing indium;
an active layer disposed on the stress control layer and including a nitride semiconductor containing indium; and
a second conductivity-type nitride semiconductor layer disposed on the active layer;
a driving unit driving the nanostructure semiconductor light emitting device; and
an external connection unit supplying power from an external power source to the driving unit.

* * * * *